United States Patent
Hsieh et al.

(10) Patent No.: US 9,029,052 B1
(45) Date of Patent: May 12, 2015

(54) PHOTOSENSITIVE RESIN COMPOSITION, COLOR FILTER AND METHOD FOR MANUFACTURING THE SAME, AND LIQUID CRYSTAL DISPLAY APPARATUS

(71) Applicant: Chi Mei Corporation, Tainan (TW)

(72) Inventors: Bar-Yuan Hsieh, Taichung (TW); Jung-Pin Hsu, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/554,067

(22) Filed: Nov. 26, 2014

(30) Foreign Application Priority Data

Dec. 5, 2013 (TW) .............................. 102144703 U

(51) Int. Cl.
*G03F 7/038* (2006.01)
*G02B 1/04* (2006.01)
*G02B 5/23* (2006.01)
*G02B 5/22* (2006.01)
*G03F 7/00* (2006.01)

(52) U.S. Cl.
CPC .. *G02B 1/04* (2013.01); *G02B 5/23* (2013.01); *G03F 7/0388* (2013.01); *G02B 5/223* (2013.01); *G03F 7/0007* (2013.01)

(58) Field of Classification Search
CPC ....... G03F 7/0007; G03F 7/0388; G02B 1/04; G02B 5/23; G02B 5/223
USPC ........................................ 430/7, 285.1, 287.1
See application file for complete search history.

(56) References Cited

U.S. PATENT DOCUMENTS

| | | | | |
|---|---|---|---|---|
| 5,721,076 A | * | 2/1998 | Watanabe et al. | 430/7 |
| 2013/0142966 A1 | * | 6/2013 | Hsieh et al. | 428/1.31 |

FOREIGN PATENT DOCUMENTS

| | | | |
|---|---|---|---|
| JP | H09325494 | | 12/1997 |
| JP | H11231516 | | 8/1999 |
| JP | 2008-201881 A | * | 9/2008 |
| JP | 2013182230 | | 9/2013 |
| JP | 2013231869 | | 11/2013 |
| WO | 2009144115 | | 12/2009 |

OTHER PUBLICATIONS

Computer-generated translation of JP 2008-201881 (Sep. 2008).*
"Office Action of Taiwan Counterpart Application," issued on Jan. 28, 2015, p. 1-p. 3.

* cited by examiner

*Primary Examiner* — John A McPherson
(74) *Attorney, Agent, or Firm* — Jianq Chyun IP Office

(57) ABSTRACT

A photosensitive resin composition, a color filter and a method for manufacturing the same, and a liquid crystal display apparatus are provided. The photosensitive resin composition includes a pigment, an alkali-soluble resin, a compound containing an ethylenically unsaturated group, a photoinitiator, and an organic solvent. The photosensitive resin composition has the advantages of high contrast, low post-baking color difference, and good linearity of high precision pattern.

17 Claims, 1 Drawing Sheet

PHOTOSENSITIVE RESIN COMPOSITION, COLOR FILTER AND METHOD FOR MANUFACTURING THE SAME, AND LIQUID CRYSTAL DISPLAY APPARATUS

CROSS-REFERENCE TO RELATED APPLICATION

This application claims the priority benefit of Taiwan application serial no. 102144703, filed on Dec. 5, 2013. The entirety of the above-mentioned patent application is hereby incorporated by reference herein and made a part of this specification.

BACKGROUND OF THE INVENTION

1. Field of the Invention

The invention is related to a photosensitive resin composition for a color filter and a color filter formed thereby. More particularly, the invention is related to a photosensitive resin composition for a color filter having high contrast, low post-baking color difference, and good linearity of high precision pattern.

2. Description of Related Art

Currently, the color filter has been widely used in applications such as color liquid crystal displays, color fax machines, and color cameras. Moreover, with the ever expanding market demand for imaging equipment such as the color liquid crystal display, the production techniques of the color filter are also diversifying so as to meet the need of the market demand.

The color filter is generally manufactured by forming, for instance, red, green, and blue pixels on a transparent glass substrate via a method such as dyeing, printing, electro-deposition, or pigment dispersion. Generally, to further increase the contrast of the color filter, a light-shielding layer (also referred to as a black matrix) can further be disposed between pixel color layers formed by the pixels.

In the average color filter, the photosensitive resin composition used for red pixels is C.I. pigment red 254 (that is, a diketopyrrolopyrrole chloride pigment), which can increase brightness but has poor contrast.

The research of Japanese Laid-Open No. 1999-231516 and International Publication No. 2009/144115 further disclose that using a diketopyrrolopyrrole bromide pigment can improve brightness and contrast at the same time. However, the diketopyrrolopyrrole bromide pigment has the drawbacks of large post-baking color difference and poor linearity of high precision pattern.

Therefore, how to improve the issues of large post-baking color difference and poor linearity of high precision pattern at the same time so as to meet the need of the current industry is an issue that those skilled in the art urgently need to solve.

SUMMARY OF THE INVENTION

Accordingly, the invention provides a photosensitive resin composition for a color filter of a liquid crystal display apparatus. The photosensitive resin composition can improve the issues of large post-baking color difference and poor linearity of high precision pattern.

The invention provides a photosensitive resin composition for a color filter. The photosensitive resin composition includes a pigment (A), an alkali-soluble resin (B), a compound (C) containing an ethylenically unsaturated group, a photoinitiator (D), and an organic solvent (E). The pigment (A) includes a first pigment (A-1) represented by formula (1):

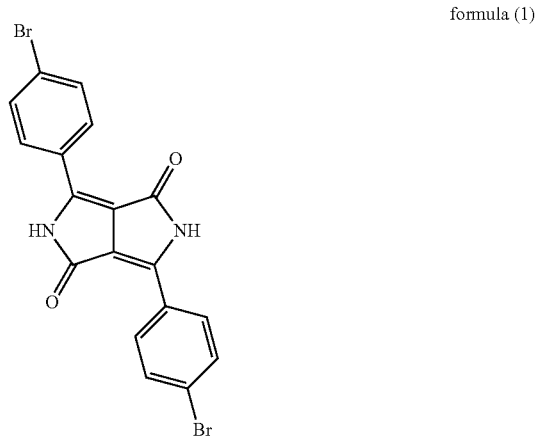 [SMILES: O=C1NC(c2ccc(Br)cc2)=C2C(=O)NC(c3ccc(Br)cc3)=C12]

formula (1)

The alkali-soluble resin (B) includes a first alkali-soluble resin (B-1) represented by formula (2):

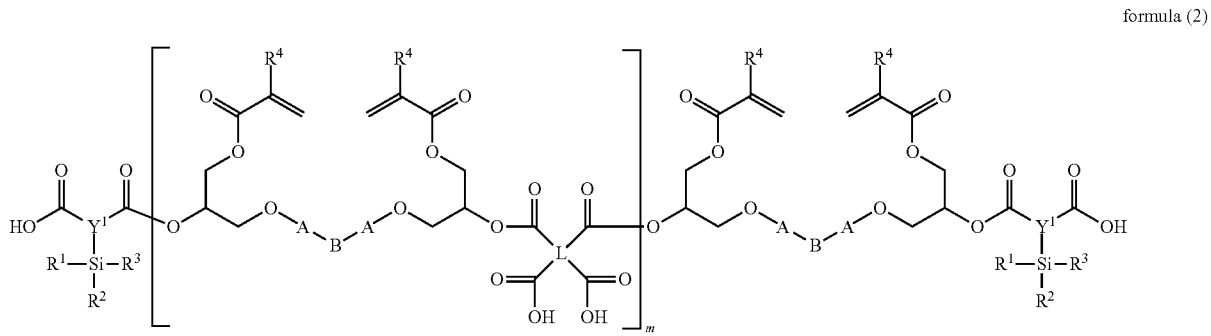

formula (2)

in formula (2), A represents a phenylene group or a phenylene group having a substituent, wherein the substituent is a $C_{1-5}$ alkyl group, a halogen atom, or a phenyl group; B represents —CO—, —SO$_2$—, —C(CF$_3$)$_2$—, —Si(CH$_3$)$_2$—, —CH$_2$—, —C(CH$_3$)$_2$—, —O—, 9,9-fluorenylidene, or a single bond; L represents a tetravalent carboxylic acid residue; $Y^1$ represents a $C_{1-20}$ trivalent organic group; $R^1$, $R^2$, and $R^3$ each independently represent a hydrogen atom, a halogen atom, or a monovalent organic group; $R^4$ represents a hydrogen atom or a methyl group; and m represents an integer of 1 to 20.

In an embodiment of the invention, the first alkali-soluble resin (B-1) is obtained by reacting a first mixture. The first mixture includes a diol compound (b-1) containing a polymeric unsaturated group, a tetracarboxylic acid or an acid dianhydride thereof (b-2), and a dicarboxylic acid anhydride (b-3) represented by formula (3), unsaturated group and the tetracarboxylic acid or an acid dianhydride thereof (b-2) is 0.2 to 1.0.

In an embodiment of the invention, the molar ratio (b-3)/(b-1) of the diol compound (b-1) containing a polymeric unsaturated group and the dicarboxylic acid anhydride (b-3) represented by formula (3) is 0.02 to 1.6.

In an embodiment of the invention, the alkali-soluble resin (B) further includes a second alkali-soluble resin (B-2) other than the first alkali-soluble resin (B-1). The second alkali-soluble resin (B-2) is obtained by reacting a second mixture. The second mixture includes an epoxy compound having at least two epoxy groups and a compound having at least one carboxylic acid group and at least one ethylenically unsaturated group.

In an embodiment of the invention, the epoxy compound having at least two epoxy groups includes a compound represented by formula (4), a compound represented by formula (5), or a combination of the two:

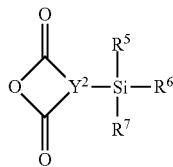

formula (3)

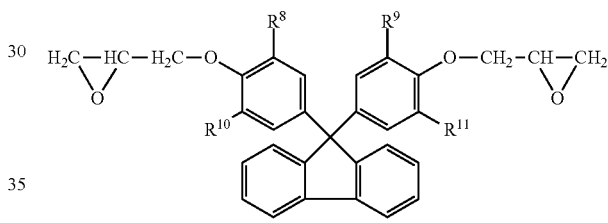

formula (4)

in formula (3), $Y^2$ represents a $C_{1-20}$ trivalent organic group; and $R^5$, $R^6$, and $R^7$ each independently represent a hydrogen atom, a halogen atom, or a monovalent organic group.

In an embodiment of the invention, the molar ratio (b-2)/(b-1) of the diol compound (b-1) containing a polymeric in formula (4), $R^8$, $R^9$, $R^{10}$, and $R^{11}$ each independently represent a hydrogen atom, a halogen atom, a $C_1$-$C_5$ alkyl group, a $C_1$-$C_5$ alkoxy group, a $C_6$-$C_{12}$ aryl group, or a $C_6$-$C_{12}$ aralkyl group,

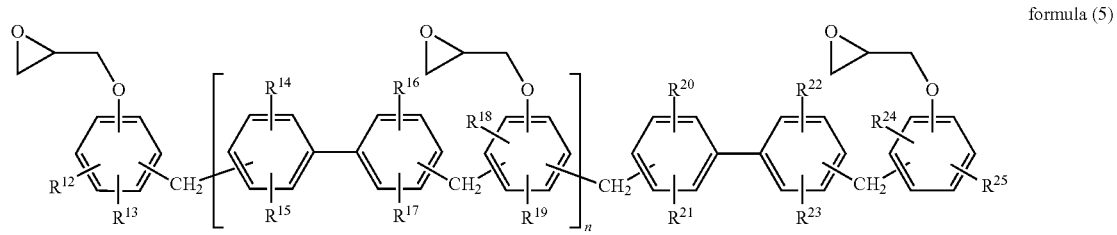

formula (5)

in formula (5), $R^{12}$ to $R^{25}$ each independently represent a hydrogen atom, a halogen atom, a $C_1$-$C_8$ alkyl group, or a $C_6$-$C_{15}$ aromatic group, and n represents an integer of 0 to 10.

In an embodiment of the invention, the weight ratio of the first alkali-soluble resin (B-1) and the second alkali-soluble resin (B-2) is at least 10:90 and less than 100:0.

In an embodiment of the invention, based on a usage amount of 100 parts by weight of the alkai-soluble resin (B), the usage amount of the pigment (A) is 60 parts by weight to 600 parts by weight, the usage amount of the first pigment (A-1) is 40 parts by weight to 400 parts by weight, the usage amount of the compound (C) containing an ethylenically unsaturated group is 40 parts by weight to 400 parts by weight, the usage amount of the photoinitiator (D) is 10 parts by weight to 100 parts by weight, and the usage amount of the organic solvent (E) is 500 parts by weight to 5000 parts by weight.

In an embodiment of the invention, the pigment (A) further includes a second pigment (A-2) other than the first pigment (A-1). The second pigment (A-2) is selected from the group consisting of a diketopyrrolopyrrole pigment, an azo pigment, an anthraquinone pigment, a perylene pigment, a quinacridone pigment, a benzimidazolone pigment, and a quinoline pigment.

In an embodiment of the invention, based on a usage amount of 100 parts by weight of the alkali-soluble resin (B), the usage amount of the second pigment (A-2) is 20 parts by weight to 200 parts by weight.

In an embodiment of the invention, the compound (C) containing an ethylenically unsaturated group includes a first compound (C-1). The first compound (C-1) is selected from the group consisting of a compound represented by formula (6), a compound represented by formula (7), and a compound represented by formula (8):

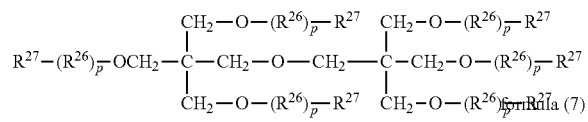

formula (6)

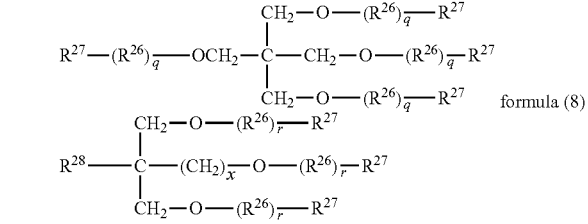

formula (7)

formula (8)

in formula (6) to formula (8), $R^{26}$ each independently represents $-(CH_2CH_2O)-$ or $-(CH_2CH(CH_3)O)-$; $R^{27}$ each independently represents an acryloyl group, a methacryloyl group, or a hydrogen atom; $R^{28}$ each independently represents a hydrogen atom, a $C_1$-$C_6$ alkyl group or a $C_1$-$C_6$ aryl group; in formula (6), the total number of the acryloyl groups and the methacryloyl groups is 5 or 6; in formula (7), the total number of the acryloyl groups and the methacryloyl groups is 3 or 4; in formula (8), the total number of the acryloyl groups and the methacryloyl groups is 3; p each independently represents an integer of 0 to 6, and the sum of each p is 3 to 24; q each independently represents an integer of 0 to 6, and the sum of each q is 2 to 16; r each independently represents an integer of 0 to 10, and the sum of each r is 3 to 30; and x represents an integer of 0 to 3.

In an embodiment of the invention, based on a usage amount of 100 parts by weight of the alkali-soluble resin (B), the usage amount of the first compound (C-1) is 5 parts by weight to 60 parts by weight.

In an embodiment of the invention, the compound (C) containing an ethylenically unsaturated group includes a second compound (C-2). The second compound (C-2) is a compound represented by formula 9:

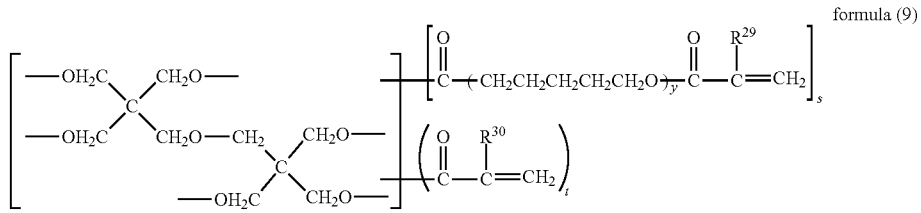

formula (9)

in formula (9), $R^{29}$ and $R^{30}$ each independently represent a hydrogen atom or a methyl group; y represents an integer of 1 to 2; s represents an integer of 1 to 6; t represents an integer of 0 to 5; and the sum of s and t is 2 to 6.

In an embodiment of the invention, based on a usage amount of 100 parts by weight of the alkali-soluble resin (B), the usage amount of the second compound (C-2) is 5 parts by weight to 60 parts by weight.

The invention further provides a method for manufacturing a color filter. The method includes using a pixel layer formed by the photosensitive resin composition for a color filter above.

The invention further provides a color filter. The color filter is obtained by the method above.

The invention further provides a liquid crystal display apparatus. The liquid crystal display apparatus includes the color filter above.

Based on the above, when the photosensitive resin composition of the invention is used to form a color filter, the issues of large post-baking color difference and poor linearity of high precision pattern can be improved. As a result, the photosensitive resin composition of the invention is suitable for a color filter and a liquid crystal display apparatus.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Photosensitive Resin Composition for Color Filter

Figure 1:
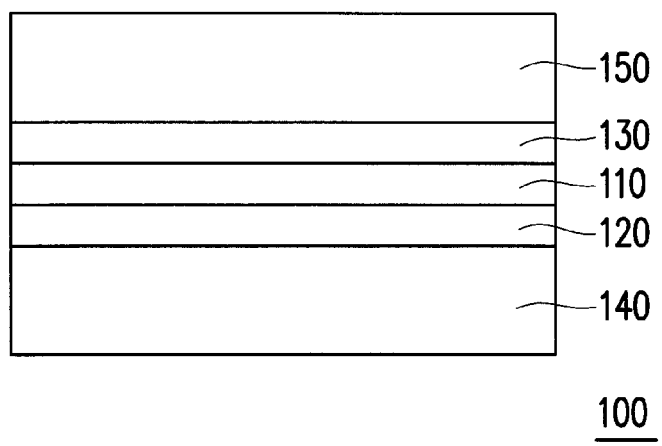
FIG. 1 is a schematic diagram illustrated according to a detection apparatus of contrast in the evaluation methods of the invention.

The invention provides a photosensitive resin composition for a color filter. The photosensitive resin composition includes a pigment (A), an alkali-soluble resin (B), a compound (C) containing an ethylenically unsaturated group, a photoinitiator (D), and an organic solvent (E). Moreover, the photosensitive resin composition for a color filter can further include an additive (F) if needed.

In the following, the individual compositions used in the photosensitive resin composition for a color filter (also referred to as a photosensitive resin composition hereinafter) of the invention are described in detail.

It should be mentioned that, in the following, (meth)acrylic acid represents acrylic acid and/or methacrylic acid, and (meth)acrylate represents acrylate and/or methacrylate. Similarly, (meth)acryloyl group represents acryloyl group and/or methacryloyl group.

Pigment (A)

The pigment (A) includes a first pigment (A-1). Moreover, the pigment (A) can optionally include a second pigment (A-2).

First Pigment (A-1)

The first pigment (A-1) is a red pigment, and the first pigment (A-1) is a compound represented by formula (1).

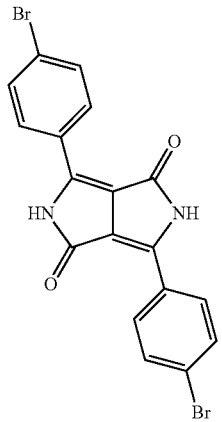

formula (1)

The first pigment (A-1) represented by formula (1) is a diketopyrrolopyrrole bromide pigment that can be prepared by the synthesis method disclosed by a known patent literature (publication number: WO 2009/144115).

The synthesis method includes, for instance, using succinic acid diester as a raw material to synthesize the diketopyrrolopyrrole bromide pigment. Specifically, 2 moles of 4-bromobenzonitrile and 1 mole of succinic acid diester are added to an inert organic solvent (such as tert-amylalcohol). Next, a condensation reaction is performed under the existence of an alkali metal or an alkali metal alkoxide and at a high temperature of 80° C. to 110° C. to form an alkali metal salt of a diketopyrrolopyrrole bromide compound. Then, water, alcohol, or an acid . . . etc. is used to protonate the alkali metal salt of the diketopyrrolopyrrole bromide compound to obtain the diketopyrrolopyrrole bromide pigment. In the protonation stage, the size of the primary particle diameter can be controlled via the temperature of the protonation, the ratio of water, alcohol, and acid used, and the additive amount of each thereof. The synthesis method is only exemplary, and the synthesis method of a diketopyrrolopyrrole bromide pigment of the invention is not limited thereto.

Based on a usage amount of 100 parts by weight of the alkali-soluble resin (B), the usage amount of the first pigment (A-1) can be 40 parts by weight to 400 parts by weight, preferably 50 parts by weight to 350 parts by weight, and more preferably 60 parts by weight to 300 parts by weight.

It should be mentioned that, when the photosensitive resin composition does not contain the first pigment (A-1), the color filter formed thereby has the issue of poor contrast.

Second Pigment (A-2)

In addition to using the first pigment (A-1) alone, the pigment (A) of the invention can also optionally use a second pigment (A-2) in a mixture of two or more. The second pigment (A-2) is generally an organic pigment or an inorganic pigment, and a pigment having high contrast and high heat resistance is preferably used.

Specific examples of the second pigment (A-2) include, other than the first pigment (A-1), a diketopyrrolopyrrole pigment; an azo pigment such as azo, disazo, or polyazo; a phthalocyanine pigment such as copper phthalocyanine, halogenated copper phthalocyanine, or metal-free phthalocyanine; an anthraquinone pigment such as amino anthraquinone, diamino dianthraquinone, anthrapyrimidine, flavanthrone, anthanthrone, indanthrone, pyranthrone, or violanthrone; a quinacridone pigment; a dioxazine pigment; a perynone pigment; a perylene pigment; a thioindigo pigment; an isoindoline pigment; an isoindolinone pigment; a quinophthalone pigment; a threne pigment; a quinoline pigment; and a benzimidazolone pigment, a metal complex pigment, and a combination of the pigments.

The second pigment (A-2) is preferably different from the first pigment (A-1). Moreover, the second pigment (A-2) is preferably selected from the group consisting of a diketopyrrolopyrrole pigment, an azo pigment, an anthraquinone pigment, a perylene pigment, a quinacridone pigment, a benzimidazolone pigment, and a quinoline pigment. The color of the pigment (A) can be adjusted by adjusting the mixing ratio of the first pigment (A-1) and the second pigment (A-2) in the pigment (A) and the mixing ratio of the various pigments in the second pigment (A-2).

Specific examples of the red pigment of the second pigment (A-2) include, for instance, the red pigments of C.I. pigment red 1, 2, 3, 4, 5, 6, 7, 8, 9, 12, 14, 15, 16, 17, 21, 22, 23, 31, 32, 37, 41, 47, 48, 48:1, 48:2, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2, 81:3, 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, and 276.

To obtain better brightness, the red pigment is preferably C.I. pigment red 48:1, 122, 168, 177, 202, 206, 207, 209, 224, 242, or 254, more preferably C.I. pigment red 177, 209, 224, 242, or 254.

Specific examples of the yellow pigment of the second pigment (A-2) include, for instance, the yellow pigments of C.I. pigment yellow 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 117, 119, 120, 126, 127, 127:1, 129, 133, 134, 136, 138, 139, 142, 147, 148, 150, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, and 208.

To obtain better brightness, the yellow pigment is preferably C.I. pigment yellow 83, 117, 129, 138, 139, 150, 154, 155, 180, or 185, more preferably C.I. pigment yellow 83, 138, 139, 150, or 180.

Specific examples of the orange pigment of the second pigment (A-2) include C.I. pigment orange 1, 2, 5, 13, 16, 17, 19, 20, 21, 22, 23, 24, 34, 36, 38, 39, 43, 46, 48, 49, 61, 62, 64, 65, 67, 68, 69, 70, 71, 72, 73, 74, 75, 77, 78, and 79.

To obtain better brightness, the orange pigment is preferably C.I. pigment orange 38 or 71.

Specific examples of the inorganic pigment of the second pigment (A-2) include, for instance, a metal oxide powder, a metal sulfide powder, or a metal powder such as barium sulfate, zinc oxide, lead sulfate, yellow lead, zinc yellow, iron oxide red [red iron(III) oxide], cadmium red, ultramarine, ferric ferro cyanide, chromium oxide green, cobalt green, amber, titanium black, synthetic iron black, titanium dioxide, or ferric ferrous oxide.

To obtain balance between brightness and saturation, and to obtain good coating properties, sensitivity, and developability, the inorganic pigment can be mixed with an organic pigment.

Based on a usage amount of 100 parts by weight of the alkali-soluble resin (B), the usage amount of the second pigment (A-2) can be 20 parts by weight to 200 parts by weight, preferably 30 parts by weight to 180 parts by weight, and more preferably 40 parts by weight to 160 parts by weight.

When the photosensitive resin composition contains the second pigment (A-2), the contrast of the color filter is better.

In the photosensitive resin composition of the invention, a dye can further be used to adjust chromaticity without reducing heat resistance. This is known by those having ordinary skill in the art and is not repeated herein.

Based on a usage amount of 100 parts by weight of the alkali-soluble resin (B), the usage amount of the pigment (A) can be 60 parts by weight to 600 parts by weight, preferably 80 parts by weight to 500 parts by weight, and more preferably 100 parts by weight to 400 parts by weight.

Alkai-Soluble Resin (B)

The alkali-soluble resin (B) includes a first alkali-soluble resin (B-1), a second alkali-soluble resin (B-2), or a combination of the two. Moreover, the alkali-soluble resin (B) can optionally include other alkai-soluble resins (B-3).

First Alkai-Soluble Resin (B-1)

The first alkali-soluble resin (B-1) is a compound represented by formula 2:

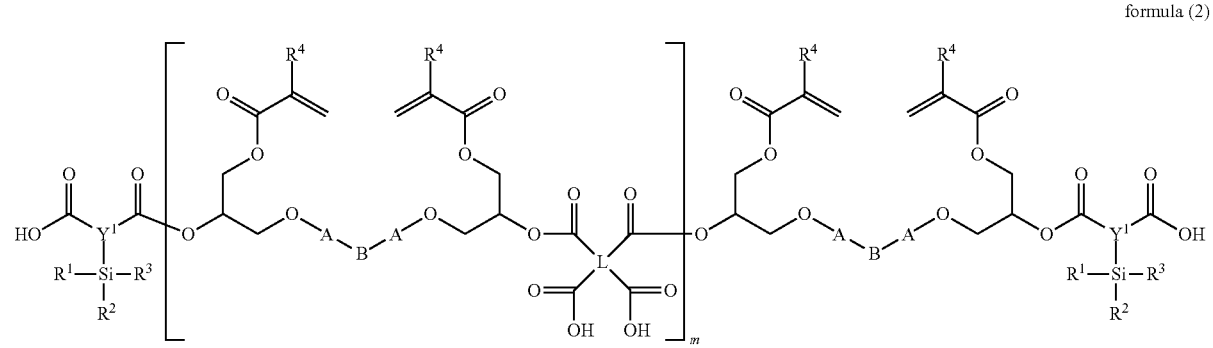

formula (2)

in formula (2), A represents a phenylene group or a phenylene group having a substituent, wherein the substituent is a $C_{1-5}$ alkyl group, a halogen atom, or a phenyl group; B represents —CO—, —SO$_2$—, —C(CF$_3$)$_2$—, —Si(CH$_3$)$_2$—, —CH$_2$—, —C(CH$_3$)$_2$—, —O—, 9,9-fluorenylidene, or a single bond; L represents a tetravalent carboxylic acid residue; $Y^1$ represents a $C_{1-20}$ trivalent organic group; $R^1$, $R^2$, and $R^3$ each independently represent a hydrogen atom, a halogen atom, or a monovalent organic group; $R^4$ represents a hydrogen atom or a methyl group; and m represents an integer of 1 to 20.

The first alkali-soluble resin (B-1) is obtained by reacting a first mixture. The first mixture includes a diol compound (b-1) containing a polymeric unsaturated group (also referred to as composition (b-1) hereinafter), a tetracarboxylic acid or an acid dianhydride thereof (b-2) (also referred to as composition (b-2) hereinafter) thereof, and a dicarboxylic acid anhydride (b-3) (also referred to as composition (b-3) hereinafter) represented by formula (3),

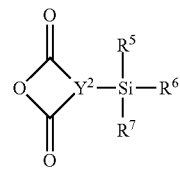

formula (3)

in formula (3), $Y^2$ represents a $C_{1-20}$ trivalent organic group; and $R^5$, $R^6$, and $R^7$ each independently represent a hydrogen atom, a halogen atom, or a monovalent organic group.

The diol compound (b-1) containing a polymeric unsaturated group is obtained by reacting a bisphenol compound (b-1-i) having two epoxy groups and a compound (b-1-ii) having at least one carboxylic acid group and at least one ethylenically unsaturated group. The reactants used to synthesize the diol compound (b-1) containing a polymeric unsaturated group can also contain other compounds.

The bisphenol compound (b-1-i) having two epoxy groups can, for instance, be obtained by reacting a bisphenol compound and an epihalohydrin in a dehydrohalogenation reaction under the existence of an alkali metal hydroxide.

Specific examples of the bisphenol used to synthesize the bisphenol compound (b-1-i) having two epoxy groups include, for instance, bis(4-hydroxyphenyl)ketone, bis(4-hydroxy-3,5-dimethylphenyl)ketone, bis(4-hydroxy-3,5-dichlorophenyl)ketone, bis(4-hydroxyphenyl)sulfone, bis(4-hydroxy-3,5-dimethylphenyl)sulfone, bis(4-hydroxy-3,5-dichlorophenyl)sulfone, bis(4-hydroxyphenyl)hexafluoropropane, bis(4-hydroxy-3,5-dimethylphenyl)hexafluoropropane, bis(4-hydroxy-3,5-dichlorophenyl)hexafluoropropane, bis(4-hydroxyphenyl)dimethylsilane, bis(4-hydroxy-3,5-dimethylphenyl)dimethylsilane, bis(4-hydroxy-3,5-dichlorophenyl)dimethylsilane, bis(4-hydroxyphenyl)methane, bis(4-hydroxy-3,5-dichlorophenyl)methane, bis(4-hydroxy-3,5-dibromophenyl)methane, 2,2-bis(4-hydroxyphenyl)propane, 2,2-bis(4-hydroxy-3,5-dimethylphenyl)propane, 2,2-bis(4-hydroxy-3,5-dichlorophenyl)propane, 2,2-bis(4-hydroxy-3-methylphenyl)propane, 2,2-bis(4-hydroxy-3-chlorophenyl)propane, bis(4-hydroxyphenyl)ether, bis(4-hydroxy-3,5-dimethylphenyl)ether, and bis(4-hydroxy-3,5-dichlorophenyl)ether; and 9,9-bis(4-hydroxyphenyl)fluorene, 9,9-bis(4-hydroxy-3,5-dimethylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3,5-dimethylphenyl)fluorene, and a combination of the compounds.

Specific examples of epihalohydrin used to synthesize the bisphenol compound (b-1-i) having two epoxy groups include epichlorohydrin, epibromohydrin, and a combination of the compounds. Based on a total equivalent of 1 equivalent of the hydroxyl group in the bisphenol compound, the usage amount of the epihalohydrin can be 1 equivalent to 20 equivalents, preferably 2 equivalents to 10 equivalents.

Specific examples of the alkali metal hydroxide include sodium hydroxide, potassium hydroxide, and a combination of the compounds. Based on a total equivalent of 1 equivalent of the hydroxyl group in the bisphenol compound, the usage amount of the alkali metal hydroxide added in the dehydrohalogenation reaction can be 0.8 equivalents to 15 equivalents, preferably 0.9 equivalents to 11 equivalents.

It should be mentioned that, before the dehydrohalogenation reaction is performed, an alkali metal hydroxide such as sodium hydroxide or potassium hydroxide can be pre-added or added during the reaction process. The operating temperature of the dehydrohalogenation reaction is 20° C. to 120° C. and the operating time thereof ranges from 1 hour to 10 hours.

In an embodiment, the alkali metal hydroxide added to the dehydrohalogenation reaction can also be an aqueous solution thereof. In the present embodiment, when an aqueous solution of the alkali metal hydroxide is continuously added in the dehydrohalogenation reaction system, water and epihalohydrin can be continuously distilled under reduced pressure or atmospheric pressure at the same time to separate and remove water, and epihalohydrin can be continuously flown back to the reaction system at the same time.

Before the dehydrohalogenation reaction is performed, a quaternary ammonium salt such as tetramethyl ammonium chloride, tetramethyl ammonium bromide, or trimethylbenzyl ammonium chloride can also be added as a catalyst. Then, at 50° C. to 150° C., the mixture is reacted for 1 hour to 5 hours, and then the alkali metal hydroxide or an aqueous solution thereof is added. Then, the mixture is reacted for 1 hour to 10 hours at a temperature of 20° C. to 120° C. to perform the dehydrohalogenation reaction.

Moreover, to facilitate the dehydrohalogenation reaction, in addition to adding an alcohol such as methanol or ethanol, an aprotic polar solvent such as dimethyl sulfone or dimethyl sulfoxide can also be added to perform the reaction. When an alcohol is used, based on a total amount of 100 wt % of the epihalohydrin, the usage amount of the alcohol can be 2 wt % to 20 wt %, preferably 4 wt % to 15 wt %. When an aprotic polar solvent is used, based on a total amount of 100 wt % of the epihalohydrin, the usage amount of the aprotic polar solvent can be 5 wt % to 100 wt %, preferably 10 wt % to 90 wt %.

After the dehydrohalogenation reaction is complete, a rinse treatment can be optionally performed. Then, the epihalohydrin, the alcohol, and the aprotic polar solvent . . . etc. are removed by using a method of heating under reduced pressure, such as at a temperature of 110° C. to 250° C. and a pressure of 1.3 kPa (10 mmHg).

To prevent the epoxy resin formed from containing a hydrolyzable halogen, the solution after the dehydrohalogenation reaction can be added to a solvent such as benzene, toluene, or methyl isobutyl ketone, and then an aqueous solution of the alkali metal hydroxide such as sodium hydroxide or potassium hydroxide can be added to perform the dehydrohalogenation reaction again. In the dehydrohalogenation reaction, based on a total equivalent of 1 equivalent of the hydroxyl group in the bisphenol compound, the usage amount of the alkali metal hydroxide is 0.01 moles to 1 mole, preferably 0.05 moles to 0.9 moles. Moreover, the operating temperature of the dehydrohalogenation reaction ranges from 50° C. to 120° C. and the operating time thereof ranges from 0.5 hours to 2 hours.

After the dehydrohalogenation reaction is complete, the salt is removed through steps such as filtering and rinsing. Moreover, solvents such as benzene, toluene, and methyl isobutyl ketone can be distilled by a method of heating under reduced pressure to obtain the bisphenol compound (b-1-i) having two epoxy groups.

The bisphenol compound (b-1-i) having two epoxy groups is preferably a bisphenol compound having two epoxy groups represented by formula (2-1) or a polymer formed by polymerizing a monomer of a bisphenol compound having two epoxy groups represented by formula (2-2).

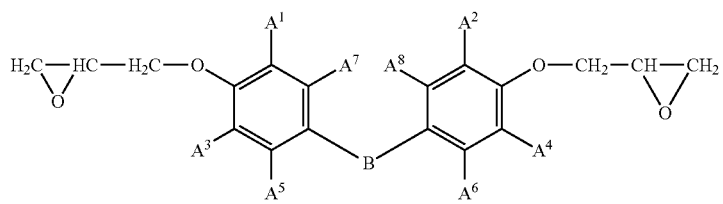

formula (2-1)

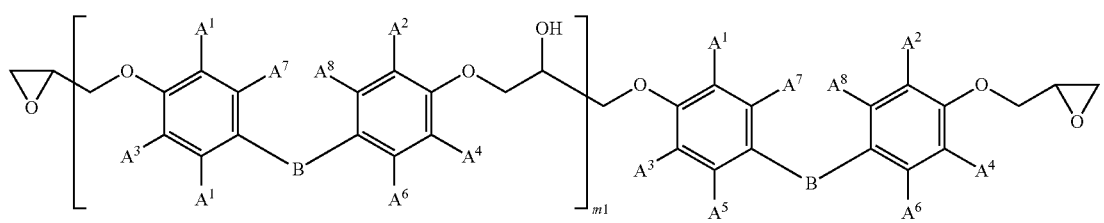

(formula 2-2)

In formula (2-1) and formula (2-2), $A^1$ to $A^8$ each independently represent a hydrogen atom, a halogen atom, a $C_1$-$C_5$ alkyl group, or a $C_1$-$C_5$ phenyl group.

B represents —CO—, —SO$_2$—, —C(CF$_3$)$_2$—, —Si(CH$_3$)$_2$—, —CH$_2$—, —C(CH$_3$)$_2$—, —O—, 9,9-fluorenylidene, or a single bond. ml can represent an integer of 1 to 10, and ml preferably represents an integer of 1 to 2.

The bisphenol compound having two epoxy groups represented by formula (2-1) is preferably a bisphenol compound having two epoxy groups represented by formula (2-3).

formula (2-3)

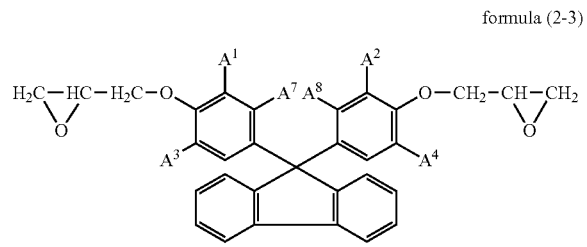

In formula (2-3), $A^1$ to $A^8$ each independently represent a hydrogen atom, a halogen atom, a $C_1$-$C_5$ alkyl group, or a phenyl group.

The bisphenol compound having two epoxy groups represented by formula (2-3) is, for instance, a bisphenol compound having two epoxy groups obtained by reacting a bisphenol fluorene compound and an epihalohydrin.

Specific examples of the bisphenol fluorene compound include 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, and a combination of the compounds.

Specific examples of epihalohydrin include epichlorohydrin, epibromohydrin, and a combination of the compounds.

Specific examples of the bisphenol fluorene compound having an epoxy group include (1) a product manufactured by Nippon Steel Chemical Co., Ltd. such as ESF-300 or a similar compound thereof; (2) a product manufactured by Osaka Gas Co., Ltd. such as PG-100, EG-210, or a similar compound thereof; and (3) a product manufactured by S.M.S. Technology Co. such as SMS-F9PhPG, SMS-F9CrG, SMS-F914PG, or a similar compound thereof.

The compound (b-1-ii) having at least one carboxylic acid group and at least one ethylenically unsaturated group is at least one compound selected from the group consisting of, for instance, the following compounds: acrylic acid, methacrylic acid, 2-methacryloyloxyethylbutanedioic acid, 2-methacryloyloxybutylbutanedioic acid, 2-methacryloyloxyethylhexanedioic acid, 2-methacryloyloxybutylhexanedioic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropylhexanedioic acid, 2-methacryloyloxypropyltetrahydrophthalic acid, 2-methacryloyloxypropylphthalic acid, 2-methacryloyloxybutylphthalic acid, and 2-methacryloyloxybutylhydrophthalic acid; a compound obtained by reacting (meth)acrylate containing a hydroxyl group and a dicarboxylic acid compound, wherein the dicarboxylic acid compound contains, but is not limited to, adipic acid, succinic acid, maleic acid, or phthalic acid; and a hemiester compound obtained by reacting (meth)acrylate containing a hydroxyl group and a carboxylic acid anhydride compound, wherein the (meth)acrylate containing a hydroxyl group contains, but is not limited to, (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, or pentaerythritol trimethacrylate. Moreover, the carboxylic acid anhydride compound can be the same as the composition (b-2) above and the composition (b-4) in the following and is therefore not repeated herein.

The tetracarboxylic acid or an acid dianhydride thereof (b-2) is at least one selected from the group consisting of saturated straight-chain hydrocarbon tetracarboxylic acid, alicyclic tetracarboxylic acid, aromatic tetracarboxylic acid, and an acid dianhydride of each of the carboxylic acids.

Specific examples of the saturated straight-chain hydrocarbon tetracarboxylic acid include butanetetracarboxylic acid, pentanetetracarboxylic acid, hexanetetracarboxylic acid, and a combination of the compounds. The saturated straight-chain hydrocarbon tetracarboxylic acid can also have a substituent.

Specific examples of the alicyclic tetracarboxylic acid include cyclobutanetetracarboxylic acid, cyclopentanetetracarboxylic acid, cyclohexanetetracarboxylic acid, norbornane tetracarboxylic acid, and a combination of the compounds. The alicyclic tetracarboxylic acid can also have a substituent.

Specific examples of the aromatic tetracarboxylic acid include pyromellitic acid, benzophenone tetracarboxylic acid, biphenyltetracarboxylic acid, biphenylether tetracarboxylic acid, diphenylsulfonetetracarboxylic acid, 1,2,3,6-tetrahydrophthalic acid, and a combination of the compounds.

The tetracarboxylic acid or an acid dianhydride thereof (b-2) is preferably biphenyltetracarboxylic acid, benzophenone tetracarboxylic acid, biphenylether tetracarboxylic acid, or an acid dianhydride of one of the carboxylic acids, and more preferably biphenyltetracarboxylic acid, biphenylether tetracarboxylic acid, or an acid dianhydride of one of the carboxylic acids.

In the case that the first alkali-soluble resin (B-1) of the invention is used as a composition for the photosensitive resin composition described later, when the molar ratio (b-2)/(b-1) of the diol compound (b-1) containing a polymeric unsaturated group and the tetracarboxylic acid or an acid dianhydride thereof (b-2) is 0.2 to 1.0, the linearity of high precision pattern of the photosensitive resin composition is better.

Specific examples of the dicarboxylic acid anhydride (b-3) represented by formula (3) include trimethoxysilylpropyl succinic anhydride, triethoxysilylpropyl succinic anhydride, methyldimethoxysilylpropyl succinic anhydride, methyldiethoxysilylpropyl succinic anhydride, trimethoxysilylbutyl succinic anhydride, triethoxysilylbutyl succinic anhydride, methyldiethoxysilylbutyl succinic anhydride, para-(trimethoxysilyl)phenyl succinic anhydride, para-(triethoxysilyl)phenyl succinic anhydride, para-(methyldimethoxysilyl)phenyl succinic anhydride, para-(methyldiethoxysilyl)phenyl succinic anhydride, meta-(trimethoxysilyl)phenyl succinic anhydride, meta-(triethoxysilyl)phenyl succinic anhydride, meta-(methyldiethoxysilyl)phenyl succinic anhydride, and a combination of the compounds.

The dicarboxylic acid anhydride (b-3) represented by formula (3) is preferably trimethoxysilylpropyl succinic anhydride, triethoxysilylpropyl succinic anhydride, para-(trimethoxysilyl)phenyl succinic anhydride, para-(triethoxysilyl)phenyl succinic anhydride, meta-(trimethoxysilyl)phenyl succinic anhydride, meta-(triethoxysilyl)phenyl succinic anhydride, or a combination of the compounds.

In the case that the first alkali-soluble resin (B-1) of the invention is used as a composition for the photosensitive resin composition described later, when the molar ratio (b-3)/(b-1) of the diol compound (b-1) containing a polymeric unsaturated group and the dicarboxylic acid anhydride (b-3) represented by formula (3) is 0.02 to 1.6, the linearity of high precision pattern of the photosensitive resin composition is better.

In the mixture for the synthesis reaction of the alkali-soluble resin, if the dicarboxylic acid anhydride (b-3) represented by formula (3) is not contained, then when the alkali-soluble resin is used as a composition for the photosensitive resin composition described later, the resulting post-baking color difference is large and the linearity of high precision pattern is poor.

In addition to the diol compound (b-1) containing a polymeric unsaturated group, the tetracarboxylic acid or an acid dianhydride thereof (b-2), and the dicarboxylic acid anhydride (b-3) represented by formula (3), the alkali-soluble resin of the invention can also contain a composition (b-4).

The composition (b-4) contains dicarboxylic acid or an acid anhydride thereof, but does not contain the dicarboxylic acid anhydride (b-3) represented by formula (3). Specific examples of the dicarboxylic acid include saturated straight-chain hydrocarbon dicarboxylic acid, saturated cyclic hydrocarbon dicarboxylic acid, unsaturated dicarboxylic acid, and a combination of the compounds.

Specific examples of the saturated straight-chain hydrocarbon dicarboxylic acid include succinic acid, acetyl succinic acid, adipic acid, azelaic acid, citramalic acid, malonic acid, glutaric acid, citric acid, tataric acid, ketogluconic acid, pimelic acid, sebacic acid, suberic acid, diglycolic acid, and a combination of the compounds. The hydrocarbon group in the saturated straight-chain hydrocarbon dicarboxylic acid can also be substituted.

Specific examples of the saturated cyclic hydrocarbon dicarboxylic acid include hexahydrophthalic acid, cyclobutanedicarboxylic acid, cyclopentanedicarboxylic acid, norbornanedicarboxylic acid, hexahydrotrimellitic acid, and a combination of the compounds. The saturated cyclic hydrocarbon dicarboxylic acid can also be an alicyclic dicarboxylic acid in which a saturated hydrocarbon is substituted.

Specific examples of the unsaturated dicarboxylic acid include maleic acid, itaconic acid, phthalic acid, tetrahydrophthalic acid, methyl endo-methylene tetrahydro phthalic acid, chlorendic acid, trimellitic acid, and a combination of the compounds.

The dicarboxylic acids preferably include succinic acid, itaconic acid, tetrahydrophthalic acid, hexahydrotrimellitic acid, phthalic acid, trimellitic acid, or a combination of the dicarboxylic acids, more preferably include succinic acid, itaconic acid, tetrahydrophthalic acid, or a combination of the dicarboxylic acids.

The composition (b-4) preferably includes succinic acid anhydride, itaconic acid anhydride, tetrahydrophthalic acid anhydride, hexahydrotrimellitic acid anhydride, phthalic acid anhydride, trimellitic acid anhydride, or a combination of the dicarboxylic acid anhydrides, more preferably includes succinic acid anhydride, itaconic acid anhydride, tetrahydrophthalic acid anhydride, or a combination of the dicarboxylic acid anhydrides.

The synthesis method of the first alkali-soluble resin (B-1) is not particularly limited, and the first alkali-soluble resin (B-1) can be obtained as long as the diol compound (b-1) containing a polymeric unsaturated group, the tetracarboxylic acid or an acid dianhydride thereof (b-2), and the dicarboxylic acid anhydride (b-3) represented by formula (3) are reacted. For instance, bisphenol fluorene epoxy(meth)acrylate used as the diol compound (b-1) containing a polymeric unsaturated group is heated in a solvent such as propylene glycol monomethyl ether acetate, and the mixture is reacted with the tetracarboxylic acid or an acid dianhydride thereof (b-2) and the dicarboxylic acid anhydride (b-3) represented by formula (3) to obtain the first alkali-soluble resin (B-1) of the present application.

Moreover, the reaction conditions of the solvent and the catalyst . . . etc. used in the synthesis of the diol compound (b-1) containing a polymeric unsaturated group and the first alkali-soluble resin (B-1) of the invention are not particularly limited. However, a solvent without a hydroxyl group and having a boiling point higher than the reaction temperature is preferably used for the reaction. Specific examples of the solvent include a cellosolve solvent such as ethyl cellosolve acetate or butyl cellosolve acetate; an ether or ester solvent having a high boiling point such as diethylene glycol dimethyl ether (diglyme), ethylcarbitol acetate, butylcarbitol acetate, or propylene glycol monomethyl ether acetate; a ketone solvent such as cyclohexanone or diisobutyl ketone; and other ester solvents such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, and ethyl ethoxyacetate. The polymerization solvent can be used alone or in a combination of two or more. Moreover, specific examples of the catalyst include an ammonium salt such as tetraethylammonium bromide or benzyltriethylammonium chloride, and a phosphine catalyst such as triphenylphosphine or tris(2,6-dimethoxyphenyl)phosphine. The catalyst can be used alone or in combination. Moreover, to control the degree of polymerization, an inhibitor is generally added in the reaction solution. Specific examples of the inhibitor include methoxyphenol, methylhydroquinone, hydroquinone, 2,6-di-t-butyl-p-cresol, phenothiazine, and a similar compound thereof. The inhibitor can generally be used alone or in a combination of two or more.

Moreover, the method for reacting the diol compound (b-1) containing a polymeric unsaturated group, the tetracarboxylic acid or an acid dianhydride thereof (b-2), the dicarboxylic acid anhydride (b-3) represented by formula (3), and/or the composition (b-4) is not particularly limited. Specifically, a known method for reacting a diol compound and tetracarboxylic dianhydride at a reaction temperature of 90° C. to 140° C. as described in Japanese Patent Laid-Open Publication No. H9-325494 can be used. Preferably, the compositions are quantitatively reacted by having a carboxylic acid group as the end of each of the compounds and in a molar ratio of (b-1):(b-2):(b-3):(b-4)=(1):(0.2 to 1):(0.02 to 1.6):(0 to 0.3) of the diol compound (b-1) containing a polymeric unsaturated group, the tetracarboxylic acid or an acid dianhydride thereof (b-2), the dicarboxylic acid anhydride (b-3) represented by formula (3), and the composition (b-4). Moreover, preferably, the compositions are uniformly dissolved and reacted at a reaction temperature of 90° C. to 130° C. and then reacted and aged at a reaction temperature of 40° C. to 80° C.

The number-average molecular weight of the first alkali-soluble resin (B-1) measured by gel permeation chromatography (GPC) is, in polystyrene equivalent, preferably greater than or equal to 1,000 and less than or equal to 10,000. When the number-average molecular weight of the first alkai-soluble resin (B-1) is less than 1000, degradation of alkali resistance may result, causing a gap to be readily generated in a pattern after alkali development and significant reduction in reproducibility of a fine line pattern. When the number-average molecular weight of the first alkai-soluble resin (B-1) is higher than 10,000, poor developability readily occurs after development.

Moreover, when the photosensitive resin composition does not contain the first alkali-soluble resin (B-1), post-baking color difference is large and the linearity of high precision pattern is poor.

Second Alkai-Soluble Resin (B-2)

The second alkali-soluble resin (B-2) is obtained by reacting a second mixture. The second mixture includes an epoxy compound having at least two epoxy groups and a compound having at least one carboxylic acid group and at least one ethylenically unsaturated group. Moreover, the second mixture can further include a carboxylic acid anhydride compound, a compound having an epoxy group, or a combination of the two compounds.

The epoxy compound having at least two epoxy groups is a compound represented by formula (4), a compound represented by formula (5), or a combination of the two.

Specifically, the compound represented by formula (4) is as follows:

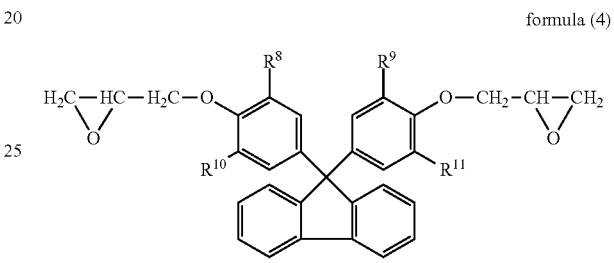

formula (4)

in formula (4), $R^8$, $R^9$, $R^{10}$, and $R^{11}$ each independently represent a hydrogen atom, a halogen atom, a $C_1$-$C_5$ alkyl group, a $C_1$-$C_5$ alkoxy group, a $C_6$-$C_{12}$ aryl group, or a $C_6$-$C_{12}$ aralkyl group.

The compound represented by formula (4) can be obtained by reacting a bisphenol fluorene compound and an epihalohydrin.

Specific examples of the bisphenol fluorene compound include: 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, a similar compound thereof, and a combination of the compounds.

Specific examples of the epihalohydrin include epichlorohydrin, epibromohydrin, a similar compound thereof, and a combination of the compounds.

Moreover, specifically, the compound represented by formula (5) is as follows:

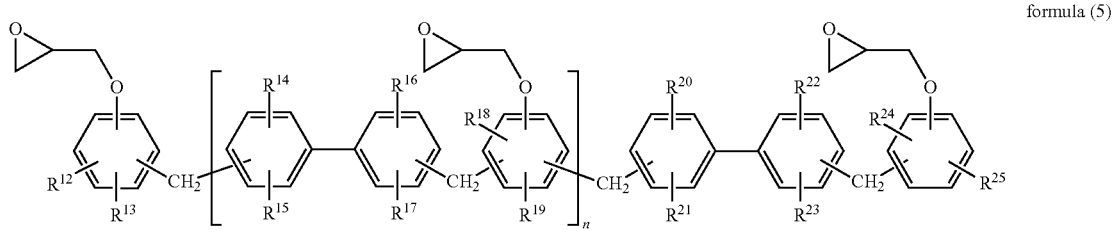

formula (5)

in formula (5), $R^{12}$ to $R^{25}$ each independently represent a hydrogen atom, a halogen atom, a $C_1$-$C_8$ alkyl group, or a $C_6$-$C_{15}$ aromatic group, and n represents an integer of 0 to 10.

The compound represented by formula (5) can be obtained by reacting a compound represented by formula (5-1) and the epihalohydrin under the existence of an alkali metal hydroxide.

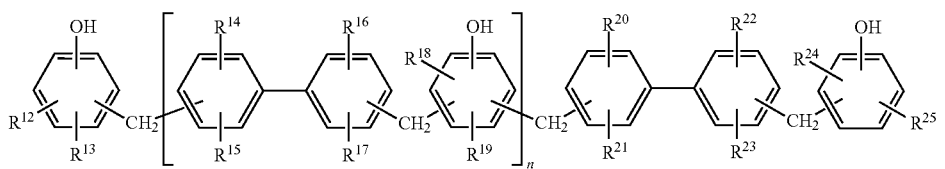

formula (5-1)

in formula (5-1), the definition of each of $R^{12}$ to $R^{25}$ and n is respectively the same as the definition of each of $R^{12}$ to $R^{25}$ and n in formula (5), and is not repeated herein.

The method for synthesizing the compound represented by formula (5-1) is as follows: first, a compound represented by formula (5-2) and a phenol are reacted in a condensation reaction under the existence of an acid catalyst to form the compound represented by formula (5-1). Then, an excess amount of the epihalohydrin is added to perform a dehydrohalogenation reaction on the epihalohydrin and the compound represented by formula (5-1), thereby obtaining the compound represented by formula (5).

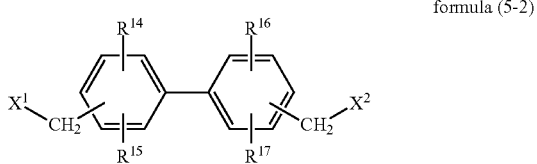

formula (5-2)

In formula (5-2), the definition of each of $R^{14}$ to $R^{17}$ is the same as the definition of each of $R^{14}$ to $R^{17}$ in formula (5), and is not repeated herein. $X^1$ and $X^2$ each independently represent a halogen atom, a $C_1$-$C_6$ alkyl group, or a $C_1$-$C_6$ alkoxy group. The halogen atom is preferably chlorine or bromine. The alkyl group is preferably a methyl group, an ethyl group, or tertiary butyl. The alkoxy group is preferably a methoxy group or an ethoxy group.

Specific examples of phenol include: phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol, and a similar compound thereof. The phenol can be used alone or in a combination of two or more.

Based on a usage amount of 1 mole of the compound represented by formula (5-2), the usage amount of the phenol is 0.5 moles to 20 moles, preferably 2 moles to 15 moles.

Specific examples of the acid catalyst include: hydrochloric acid, sulfuric acid, p-toluenesulfonic acid, oxalic acid, boron trifluoride, aluminium chloride anhydrous, zinc chloride, and a similar compound thereof. The acid catalyst is preferably p-toluenesulfonic acid, sulfuric acid, hydrochloric acid, or a combination of the compounds. The acid catalyst can be used alone or in a combination of two or more.

Moreover, the usage amount of the acid catalyst is not particularly limited. However, based on a usage amount of 100 weight percent (wt %) of the compound represented by formula (5-2), the usage amount of the acid catalyst is preferably 0.1 wt % to 30 wt %.

The condensation reaction can be performed without a solvent or under the existence of an organic solvent. Moreover, specific examples of the organic solvent include: toluene, xylene, methyl isobutyl ketone, and a similar compound thereof. The organic solvent can be used alone or in a combination of two or more.

Based on a total weight of 100 wt % of the compound represented by formula (5-2) and the phenol, the usage amount of the organic solvent is 50 wt % to 300 wt %, preferably 100 wt % to 250 wt %. Moreover, the operating temperature of the condensation reaction is 40° C. to 180° C. and the operating time of the condensation reaction is 1 hour to 8 hours.

After the condensation reaction is complete, a neutralization treatment or a rinse treatment can be performed. In the neutralization treatment, the pH value of the reacted solution is adjusted to pH 3 to pH 7, preferably pH 5 to pH 7. The rinse treatment can be performed by using a neutralizer, wherein the neutralizer is an alkaline substance, and specific examples thereof include: an alkali metal hydroxide such as sodium hydroxide, potassium hydroxide, or a similar compound thereof; an alkaline earth metal hydroxide such as calcium hydroxide, magnesium hydroxide, or a similar compound thereof; an organic amine such as diethylene triamine, triethylenetetramine, aniline, phenylene diamine, or a similar compound thereof; and ammonia, sodium dihydrogen phosphate, and a combination of the compounds. The neutralizer can be used alone or in a combination of two or more. The rinse treatment can be performed with a known method, such as adding an aqueous solution containing the neutralizer in the reacted solution and then extracting repeatedly. After the neutralization treatment or the rinse treatment, the unreacted phenol and solvent can be distilled by a heat treatment under reduced pressure, and then condensation is performed to obtain the compound represented by formula (5-1).

Specific examples of the epihalohydrin include: epichlorohydrin, epibromohydrin, and a combination of the compounds. Before the dehydrohalogenation reaction is performed, an alkali metal hydroxide such as sodium hydroxide or potassium hydroxide can be pre-added or added during the reaction process. The operating temperature of the dehydrohalogenation reaction is 20° C. to 120° C. and the operating time thereof ranges from 1 hour to 10 hours.

In an embodiment, the alkali metal hydroxide added in the dehydrohalogenation reaction can also be an aqueous solution thereof. In the present embodiment, when an aqueous solution of the alkali metal hydroxide is continuously added in the dehydrohalogenation reaction system, water and epihalohydrin can be continuously distilled under reduced pressure or atmospheric pressure at the same time to separate and remove water, and epihalohydrin can be continuously flown back to the reaction system.

Before the dehydrohalogenation reaction is performed, a quaternary ammonium salt such as tetramethyl ammonium chloride, tetramethyl ammonium bromide, trimethyl benzyl ammonium chloride, or a similar compound thereof can also be added as a catalyst, and then the alkali metal hydroxide or an aqueous solution thereof is added after the mixture is reacted for 1 hour to 5 hours at 50° C. to 150° C. Then, the mixture is reacted for 1 hour to 10 hours at 20° C. to 120° C. to perform the dehydrohalogenation reaction.

Based on a total equivalent of 1 equivalent of the hydroxyl group in the compound represented by formula (5-1), the usage amount of the epihalohydrin is 1 equivalent to 20 equivalents, preferably 2 equivalents to 10 equivalents. Based on a total equivalent of 1 equivalent of the hydroxyl group in the compound having a structure represented by formula (5-1), the usage amount of the alkali metal hydroxide added in the dehydrohalogenation reaction is 0.8 equivalents to 15 equivalents, preferably 0.9 equivalents to 11 equivalents.

Moreover, to facilitate the dehydrohalogenation reaction, an alcohol such as methanol, ethanol, or a similar compound thereof can also be added. In addition, an aprotic polar solvent such as dimethyl sulfone, dimethyl sulfoxide, or a similar compound thereof can also be added to perform the reaction. When an alcohol is used, based on a total amount of 100 wt % of the epihalohydrin, the usage amount of the alcohol is 2 wt % to 20 wt %, preferably 4 wt % to 15 wt %. When an aprotic polar solvent is used, based on a total amount of 100 wt % of the epihalohydrin, the usage amount of the aprotic polar solvent is 5 wt % to 100 wt %, preferably 10 wt % to 90 wt %.

After the dehydrohalogenation reaction is complete, a rinse treatment can be optionally performed. Then, the epihalohydrin, the alcohol, and the aprotic polar solvent are removed by using a method of heating at reduced pressure, such as at a temperature of 110° C. to 250° C. and a pressure of less than or equal to 1.3 kPa (10 mmHg).

To prevent the epoxy resin formed from containing a hydrolyzable halogen, the solution after the dehydrohalogenation reaction can be added in a solvent such as toluene or methyl isobutyl ketone or an aqueous solution of alkali metal hydroxide such as sodium hydroxide or potassium hydroxide, and then the dehydrohalogenation reaction is performed again. In the dehydrohalogenation reaction, based on a total equivalent of 1 equivalent of the hydroxyl group in the compound represented by formula (5-1), the usage amount of the alkali metal hydroxide is 0.01 moles to 0.3 moles, preferably 0.05 moles to 0.2 moles. Moreover, the operating temperature of the dehydrohalogenation reaction ranges from 50° C. to 120° C. and the operating time thereof ranges from 0.5 hours to 2 hours.

After the dehydrohalogenation reaction is complete, the salt is removed through steps such as filtering and rinsing. Moreover, solvents such as toluene and methyl isobutyl ketone can be distilled by a method of heating under reduced pressure to obtain the compound represented by formula (5). Specific examples of the compound represented by formula (5) include a product such as NC-3000, NC-3000H, NC-3000S, or NC-3000P manufactured by Nippon Kayaku Co., Ltd.

The specific examples of the compound having at least one carboxylic acid group and at least one ethylenically unsaturated group in the second mixture are the same as the specific examples of the compound (b-1-ii) having at least one carboxylic acid group and at least one ethylenically unsaturated group in the first mixture and are not repeated herein.

The carboxylic acid anhydride compound in the second mixture includes a tetracarboxylic acid or an acid dianhydride thereof and/or a dicarboxylic acid or an acid anhydride thereof. In particular, the specific examples of the tetracarboxylic acid or an acid dianhydride thereof are the same as the specific examples of the composition (b-2) in the first mixture and the specific examples of the dicarboxylic acid or an acid anhydride thereof are the same as the specific examples of the composition (b-4) in the first mixture and are not repeated herein.

Specific examples of the compound having an epoxy group in the second mixture include glycidyl methacrylate, 3,4-epoxycyclohexylmethacrylate, a glycidyl ether compound having an unsaturated group, an unsaturated compound having an epoxy group, or a combination of the compounds. Specific examples of the glycidyl ether compound having an unsaturated group include Denacol EX-111, EX-121 Denacol, Denacol EX-141, Denacol EX-145, Denacol EX-146, Denacol EX-171, and Denacol EX-192 (products of Nagase Kasei Kogyo Co., Ltd.)

The second alkali-soluble resin (B-2) can be obtained by performing a polymerization reaction between the epoxy compound having at least two epoxy groups and the compound having at least one carboxylic acid group and at least one ethylenically unsaturated group in the second mixture to form a reaction product having a hydroxyl group, and then reacting the reaction product having a hydroxyl group with a carboxylic acid anhydride compound. Based on a total equivalent of 1 equivalent of the hydroxyl group of the reaction product having a hydroxyl group, the equivalent of the acid anhydride group contained in the carboxylic acid anhydride compound is preferably 0.4 equivalents to 1 equivalent, more preferably 0.75 equivalents to 1 equivalent. When a plurality of the carboxylic acid anhydride compound is used, the plurality of the carboxylic acid anhydride compound can be added in the reaction in sequence or at the same time. Moreover, the operating temperature of the reaction ranges from 50° C. to 130° C.

The second alkali-soluble resin (B-2) can also be obtained by reacting the epoxy compound having at least two epoxy groups and the compound having at least one carboxylic acid group and at least one ethylenically unsaturated group to form a reaction product having a hydroxyl group, and then performing a polymerization reaction between the reaction product having a hydroxyl group and a carboxylic acid anhydride compound and/or a compound having an epoxy group. Based on a total equivalent of 1 equivalent of the epoxy groups on the epoxy compound having at least two epoxy groups, the acid value equivalent of the compound having at least one carboxylic acid group and at least one ethylenically unsaturated group is preferably 0.8 equivalents to 1.5 equivalents, more preferably 0.9 equivalents to 1.1 equivalents. Based on a total amount of 100 mole percent (mole %) of the hydroxyl group of the reaction product having a hydroxyl group, the usage amount of the carboxylic acid anhydride compound is 10 mole % to 100 mole %, preferably 20 mole % to 100 mole %, and more preferably 30 mole % to 100 mole %.

When preparing the first alkali-soluble resin (B-1), to speed up the reaction, an alkali compound is generally added in the reaction solution as a reaction catalyst. Specific examples of the reaction catalyst include triphenyl phosphine, tris(2,6-dimethoxyphenyl)phosphine, triphenyl stibine, triethylamine, triethanolamine, tetramethylammonium chloride, benzyltriethylammonium chloride, and a combination of the reaction catalysts. The reaction catalyst can be used alone or in a combination of two or more.

Moreover, to control the degree of polymerization, an inhibitor is generally added in the reaction solution. Specific examples of the inhibitor include methoxyphenol, methylhydroquinone, hydroquinone, 2,6-di-t-butyl-p-cresol, phenothiazine, and a similar compound thereof. The inhibitor can generally be used alone or in a combination of two or more.

When preparing the first alkali-soluble resin (B-1), a polymerization solvent can be used when needed. Specific examples of the polymerization solvent include: an alcohol compound such as ethanol, propanol, isopropanol, butanol, isobutanol, 2-butanol, hexanol, ethylene glycol, or a similar compound thereof; a ketone compound such as methyl ethyl ketone, cyclohexanone, or a similar compound thereof; an aromatic hydrocarbon compound such as toluene, xylene, or a similar compound thereof; a cellosolve compound such as cellosolve, butyl cellosolve, or a similar compound thereof; a carbitol compound such as carbitol, butyl carbitol, or a similar compound thereof; a propylene glycol alkyl ether compound such as propylene glycol monomethyl ether or a similar compound thereof; a poly(propylene glycol) alkyl ether compound such as di(propylene glycol) methyl ether or a similar compound thereof; an acetate compound such as ethyl acetate, butyl acetate, ethylene glycol monoethyl ether acetate, propylene glycol methyl ether acetate, or a similar compound thereof; an alkyl lactate compound such as ethyl lactate, butyl lactate, or a similar compound thereof; a dialkyl glycol ether; and other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate (EEP), and ethyl ethoxyacetate. The polymerization solvent can be used alone or in a combination of two or more. Moreover, the acid value of the first alkali-soluble resin (B-1) is 50 mgKOH/g to 200 mgKOH/g, preferably 60 mgKOH/g to 180 mgKOH/g.

The alkai-soluble resin (B-2) is preferably a product manufactured by Nippon Steel Chemical Co. Ltd. such as V259ME or V301ME.

The photosensitive resin composition includes the second alkali-soluble resin (B-2), and therefore the linearity of high precision pattern thereof is better.

Moreover, when the alkali-soluble resin (B) contains the first alkali-soluble resin (B-1) and the second alkali-soluble resin (B-2) at the same time, the weight ratio of the first alkali-soluble resin (B-1) and the second alkali-soluble resin (B-2) is at least 10:90 and less than 100:0. In this case, the resulting linearity of high precision pattern of the photosensitive resin composition is even better.

Other Alkai-Soluble Resins (B-3)

The alkali-soluble resin (B) can further optionally include other alkai-soluble resins (B-3). The other alkali-soluble resins (B-3) are resins other than the first alkali-soluble resin (B-1) and the second alkali-soluble resin (B-2), but are not limited to a resin having a carboxylic acid group or a hydroxyl group. Specific examples of the other alkai-soluble resins (B-3) include a resin such as an acrylic-based resin, a urethane-based resin, or a novolac resin.

Compound (C) Containing an Ethylenically Unsaturated Group

The compound (C) containing an ethylenically unsaturated group includes a first compound (C-1), a second compound (C-2), a third compound (C-3), or a combination of the compounds.

First Compound (C-1)

The first compound (C-1) is selected from the group consisting of a compound represented by formula (6), a compound represented by formula (7), and a compound represented by formula (8):

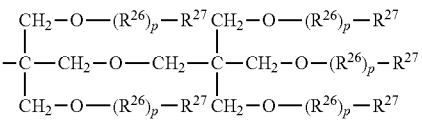

formula (6)

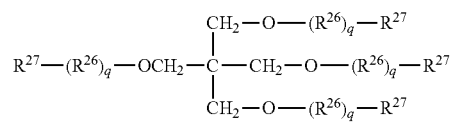

formula (7)

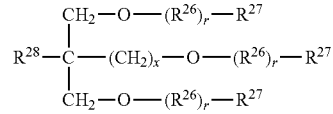

formula (8)

in formula (6) to formula (8), $R^{26}$ each independently represents $-(CH_2CH_2O)-$ or $-(CH_2CH(CH_3)O)-$; $R^{27}$ each independently represents an acryloyl group, a methacryloyl group, or a hydrogen atom; $R^{28}$ each independently represents a hydrogen atom, a $C_1$-$C_6$ alkyl group or a $C_1$-$C_6$ aryl group; in formula (6), the total number of the acryloyl groups and the methacryloyl groups is 5 or 6; in formula (7), the total number of the acryloyl groups and the methacryloyl groups is 3 or 4; in formula (8), the total number of the acryloyl groups and the methacryloyl groups is 3; p each independently represents an integer of 0 to 6, and the sum of each p is 3 to 24; q each independently represents an integer of 0 to 6, and the sum of each q is 2 to 16; r each independently represents an integer of 0 to 10, and the sum of each r is 3 to 30; and x represents an integer of 0 to 3.

In formula (6), formula (7), or formula (8), $-(CH_2CH_2O)-$ or $-(CH_2CH(CH_3)O)-$ of $R^{26}$ is preferably bonded to $R^{27}$ via the end of the oxygen atom side.

In formula (6), each of the six $R^{27}$ is preferably an acryloyl group.

The compound represented by formula (6) or the compound represented by formula (7) can be synthesized by the following steps: first, a step of bonding pentaerythritol or dipentaerythritol to an open-ring skeleton via a ring-opening addition reaction of ethylene oxide (EO) or propylene oxide (PO); and a step of reacting, for instance, (meth)acryloyl chloride and a hydroxyl group at the end the open-ring skeleton to introduce a (meth)acryloyl group.

Each of the compound represented by formula (6) and the compound represented by formula (7) is preferably a pentaerythritol derivative, a dipentaerythritol derivative, or a combination of the two.

Specific examples of the compound represented by formula (6) include compounds represented by formula (6-1) to formula (6-4). In formula (6-1) and formula (6-4), the sum of each n is 6. In formula (6-2) and formula (6-3), the sum of each n is 12. The compound represented by formula (6) is preferably formula (6-1) or formula (6-2). The compound represented by formula (6) is, for instance, a commercialized product (such as KAYARAD DPEA-12 manufactured by Nippon Kayaku Co., Ltd.)

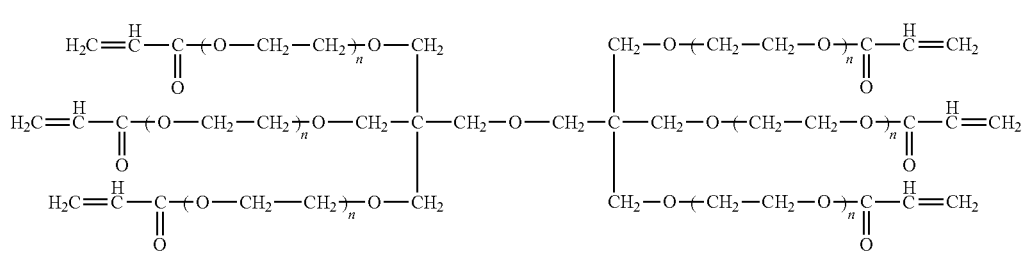

formula (6-1)

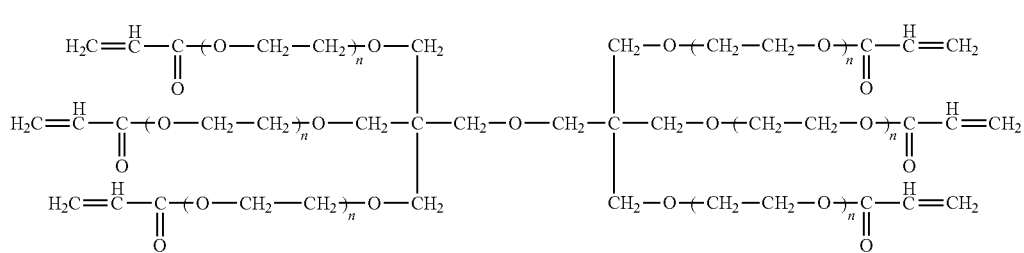

formula (6-2)

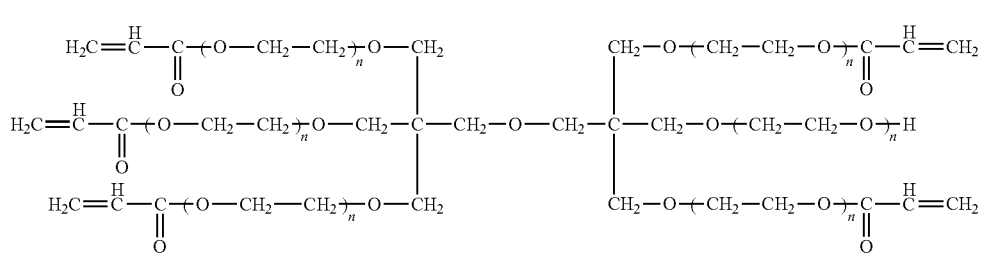

formula (6-3)

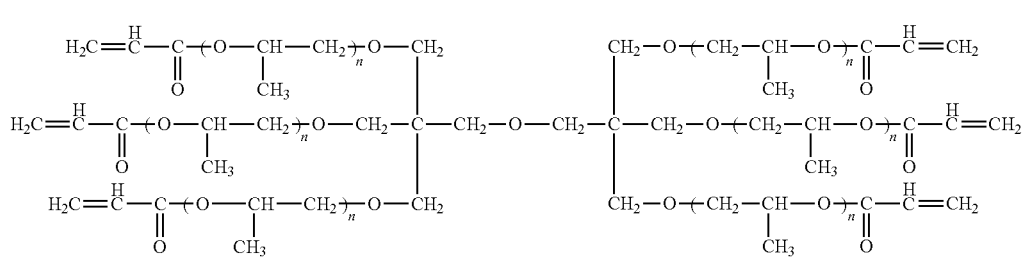

formula (6-4)

Specific examples of the compound represented by formula (7) include a compound represented by formula (7-1), a compound represented by formula (7-2), ethoxylated pentaerythritol tetraacrylate, and propoxylated pentaerythritol tetraacrylate. In formula (7-1), the sum of each k is 4. In formula (7-2), the sum of each k is 12. The compound represented by formula (7) is, for instance, a commercialized product (such as EM2411 or EM2421 manufactured by Eternal Chemical Co., Ltd. or Miramer M4004 manufactured by Toyo Chemical Co., Ltd.)

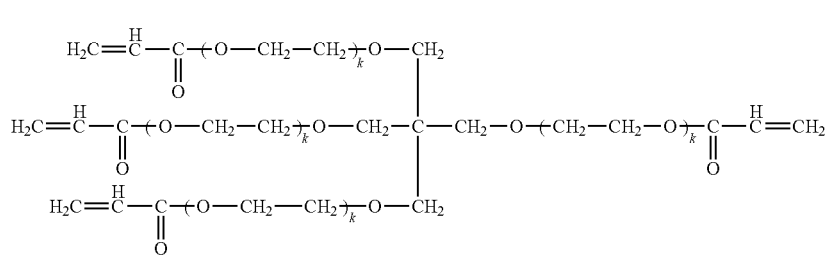

formula (7-1)

-continued

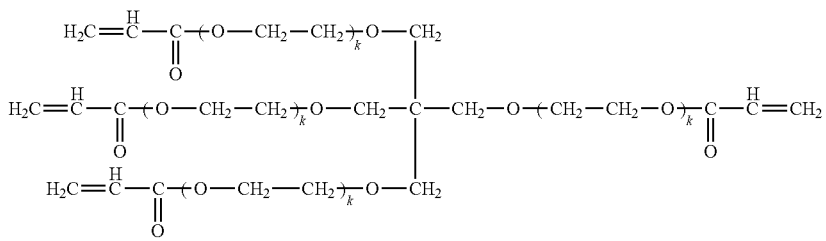

formula (7-2)

Specific examples of the compound represented by formula (8) include ethoxylated trimethylolpropane triacrylate, ethoxylated trimethylolpropane trimethacrylate, propoxylated trimethylolpropane triacrylate, and propoxylated glyceryl triacrylate. The compound represented by formula (8) is, for instance, a commercialized product (such as KAYARAD GPO-303, KAYARAD THE-330, KAYARAD TPA-320, or KAYARAD TPA-330 manufactured by Nippon Kayaku Co., Ltd., M-310, M-321, M-350, M-360, or M-460 manufactured by Toa Gosei Co., Ltd., SR415, SR454, SR492, SR499, CD501, SR502, SR9020, SR9021, or SR9035 manufactured by Shatuo Ma Co., Ltd., EM2380, EM2381, EM2382, EM2383, EM2384, EM2385, EM2386, EM2387, or EM3380 manufactured by Eternal Chemical Co., Ltd., Miramer M3130, Miramer M3160, Miramer M3190, or Miramer M360 manufactured by Japan Chemical Co., Ltd., or a combination of the compounds.)

Based on a usage amount of 100 parts by weight of the alkali-soluble resin (B), the usage amount of the first compound (C-1) can be 5 parts by weight to 60 parts by weight, preferably 8 parts by weight to 50 parts by weight, and more preferably 10 parts by weight to 40 parts by weight.

When the compound (C) containing an ethylenically unsaturated group contains the first compound (C-1), the linearity of high precision pattern of the photosensitive resin composition is better.

Second Compound (C-2)

The second compound (C-2) can be a compound represented by formula 9:

pounds. Based on a usage amount of 1 mole of the polyol having at least four functional groups, the usage amount of the caprolactone is preferably 1 mole to 12 moles.

Specific examples of the second compound (C-2) include a pentaerythritol caprolactone-modified tetra(meth)acrylate compound, a ditrimethylolpropane caprolactone-modified tetra(meth)acrylate compound, a dipentaerythritol caprolactone-modified poly(meth)acrylate compound, and a combination of the compounds. Specific examples of the dipentaerythritol caprolactone-modified poly(meth)acrylate compound include a dipentaerythritol caprolactone-modified di(meth)acrylate compound, a dipentaerythritol caprolactone-modified tri(meth)acrylate compound, a dipentaerythritol caprolactone-modified tetra(meth)acrylate compound, a dipentaerythritol caprolactone-modified penta(meth)acrylate compound, a dipentaerythritol caprolactone-modified hexa (meth)acrylate compound, and a combination of the compounds. Specifically, the second compound (C-2) is, for instance, KAYARAD DPCA-20, KAYARAD DPCA-30, KAYARAD DPCA-60, or DPCA-120 manufactured by Nippon Kayaku Co., Ltd.

Based on a usage amount of 100 parts by weight of the alkali-soluble resin (B), the second compound (C-2) can be 5 parts by weight to 60 parts by weight, preferably 8 parts by weight to 50 parts by weight, and more preferably 10 parts by weight to 40 parts by weight.

When the compound (C) containing an ethylenically unsaturated group contains the second compound (C-2), the linearity of high precision pattern of the photosensitive resin composition is better.

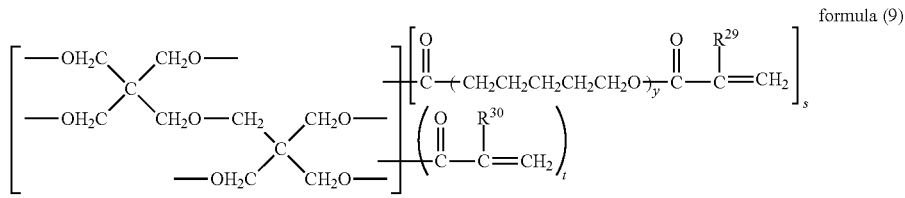

formula (9)

in formula (9), $R^{29}$ and $R^{30}$ each independently represent a hydrogen atom or a methyl group; y represents an integer of 1 to 2; s represents an integer of 1 to 6; t represents an integer of 0 to 5; and the sum of s and t is 2 to 6.

The second compound (C-2) is a (meth)acrylate compound obtained by reacting caprolactone-modified polyol and (meth)acrylic acid.

The caprolactone-modified polyol is obtained by reacting caprolactone and a polyol having at least four functional groups. The caprolactone can be γ-carpolactone, δ-carpolactone, ε-carpolactone, or a combination of the compounds, and is preferably ε-carpolactone. The polyol having at least four functional groups is, for instance, pentaerythritol, ditrimethylolpropane, dipentaerythritol, or a combination of the compounds.

Third Compound (C-3)

The third compound (C-3) has a functional group represented by formula (10).

formula (10)

In formula (10), $R^{31}$ represents hydrogen or a methyl group.

Specific examples of the third compound (C-3) include acrylamide, (meth)acryloylmorpholine, 7-amino-3,7-dimethyloctyl(meth)acrylate, iso-butoxymethyl(meth)acrylamide, iso-bornyloxyethyl(meth)acrylate, iso-bornyl(meth)acrylate, 2-ethylhexyl(meth)acrylate, ethyl diethylene glycol (meth)acrylate, t-octyl(meth)acrylamide, diacetone(meth)acrylamide, dimethylaminoethyl(meth)acrylate, dodecyl (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl (meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth) acrylate, bornyl(meth)acrylate, ethylene glycol di(meth) acrylate, dicyclopentenyl di(meth)acrylate, triethylene glycol di(meth)acrylate, tetraethylene glycol di(meth)acrylate, tri (2-hydroxyethyl) isocyanurate di(meth)acrylate, tri(2-hydroxyethyl) isocyanurate tri(meth)acrylate, caprolactone-modified tri(2-hydroxyethyl) isocyanurate tri(meth)acrylate, trimethylolpropyl tri(meth)acrylate, triethylene glycol di(meth)acrylate, neo-pentyl glycol di(meth)acrylate, 1,4-butanediol di(meth)acrylate, 1,6-hexanediol di(meth)acrylate, trimethylolpropane triacrylate, pentaerythritol tri(meth)acrylate, dipentaerythritol hexaacrylate, pentaerythritol tetra (meth)acrylate, polyester di(meth)acrylate, polyethylene glycol di(meth)acrylate, dipentaerythritol hexa(meth)acrylate, dipentaerythritol penta(meth)acrylate, dipentaerythritol tetra (meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, phenol novolac polyglycidyl ether(meth) acrylate, and a combination of the compounds.

The third compound (C-3) is preferably trimethylolpropane triacrylate, pentaerythritol triacrylate, pentaerythritol tetraacrylate, dipentaerythritol hexaacrylate, dipentaerythritol pentaacrylate, dipentaerythritol tetraacrylate, ditrimethylolpropane tetraacrylate, TO-1382 manufactured by Toagosei Co, Ltd., Japan, or a combination thereof.

Based on a usage amount of 100 parts by weight of the alkali-soluble resin (B), the usage amount of the compound (C) containing an ethylenically unsaturated group can be 40 parts by weight to 400 parts by weight, preferably 50 parts by weight to 350 parts by weight, and more preferably 60 parts by weight to 300 parts by weight.

Photoinitiator (D)

The photoinitiator (D) is, for instance, an acetophenone compound, a biimidazole compound, an acyl oxime compound, or a combination of the compounds.

Specific examples of the acetophenone compound include p-dimethylamino-acetophenone, α,α'-dimethoxyazoxy-acetophenone, 2,2'-dimethyl-2-phenyl-acetophenone, p-methoxy-acetophenone, 2-methyl-1-(4-methylthio phenyl)-2-morpholino-1-propanone, 2-benzyl-2-N,N-dimethylamino-1-(4-morpholinophenyl)-1-butanone, and a combination of the compounds.

Specific examples of the biimidazole compound include 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methyl phenyl)-4,4',5,5'-tetraphenyl-biimidazole, 2,2'-bis(o-methoxyphenyl)-4,4',5,5'-tetraphenyl-biimidazole, 2,2'-bis(o-ethylphenyl)-4,4',5,5'-tetraphenyl-biimidazole, 2,2'-bis(p-methoxyphenyl)-4,4',5,5'-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, 2,2'-bis(2,4-dichlorophenyl)-4,4',5,5'-tetraphenyl-biimidazole, and a combination of the compounds.

Specific examples of the acyl oxime compound include ethanone,1-[9-ethyl-6-(2-methylbenzoyl)-9H-carbazole-3-yl]-,1-(O-acetyl oxime) such as CGI-242 manufactured by Ciba Specialty Chemicals having a structure represented by formula (11), 1-(4-phenyl-thio-phenyl)-octane-1,2-dion 2-oxime-O-benzoate such as CGI-124 manufactured by Ciba Specialty Chemicals having a structure represented by formula (12), ethanone,1-[9-ethyl-6-(2-chloro-4-benzyl-thio-benzoyl)-9H-carbazole-3-yl]-,1-(O-acetyl oxime) manufactured by Asahi Denka Co., Ltd. having a structure represented by formula (13), and a combination of the compounds.

formula (11)

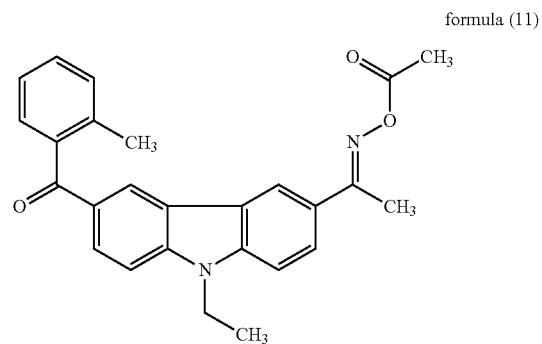

formula (12)

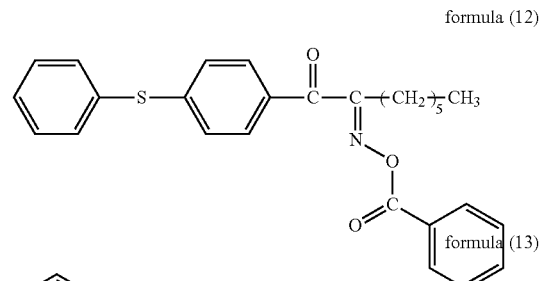

formula (13)

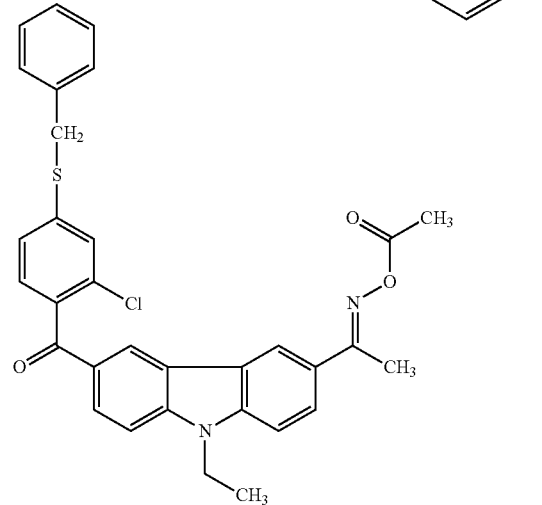

The photoinitiator (D) is preferably 2-methyl-1-(4-methylthio phenyl)-2-morpholino-1-propanone, 2-benzyl-2-N,N-dimethylamino-1-(4-morpholinophenyl)-1-butanone, 2,2'-bis(O-chlorophenyl)-4,4',5,5'-tetraphenyl-biimidazole, ethanone,1-[9-ethyl-6-(2-methylbenzoyl)-9H-carbazole-3-yl]-,1-(O-acetyl oxime), or a combination of the compounds.

The photoinitiator (D) can further include the following compounds as needed: a benzophenone compound such as thioxanthone, 2,4-diethyl-thioxanthanone, thioxanthone-4-sulfone, benzophenone, 4,4'-bis(dimethylamino)benzophenone, or 4,4'-bis(diethylamino)benzophenone; an a-diketone such as benzil or acetyl; an acyloin such as benzoin; an acyloin ether such as benzoin methylether, benzoin ethylether, or benzoin isopropyl ether; an acylphosphineoxide such as 2,4,6-trimethyl-benzoyl-diphenyl-phosphineoxide or bis-(2,6-dimethoxy-benzoyl)-2,4,4-trimethyl-benzyl-phosphineoxide; a quinone such as anthraquinone or 1,4-naphthoquinone; a halide such as phenacyl chloride, tribromomethyl-phenylsulfone, or tris(trichloromethyl)-s-triazine; a peroxide such as di-tertbutylperoxide, or a combination of the compounds. The compound added to the photoinitiator (D) is preferably a benzophenone compound, more preferably 4,4'-bis(diethylamino)benzophenone.

Based on a usage amount of 100 parts by weight of the alkali-soluble resin (B), the usage amount of the photoinitiator (D) can be 10 parts by weight to 100 parts by weight, preferably 12 parts by weight to 80 parts by weight, and more preferably 15 parts by weight to 60 parts by weight.

Organic Solvent (E)

The organic solvent (E) refers to a solvent capable of dissolving the pigment (A), the alkali-soluble resin (B), the compound (C) containing an ethylenically unsaturated group, and the photoinitiator (D), but does not react with the compositions, and preferably has a suitable volatility.

The organic solvent (E) is, for instance, a (poly)alkylene glycol monoalkyl ether, a (poly)alkylene glycol monoalkyl ether acetate, other ethers, a ketone, an alkyl lactate, other esters, an aromatic hydrocarbon compound, a carboxylic acid amide, or a combination of the solvents.

Specific examples of the (poly)alkylene glycol monoalkyl ether include ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and a combination of the solvents.

Specific examples of the (poly)alkylene glycol monoalkyl ether acetate include ethylene glycol monomethyl ether acetate, ethylene glycol monoethyl ether acetate, propylene glycol monomethyl ether acetate, propylene glycol monoethyl ether acetate, and a combination of the solvents.

Specific examples of the other ethers include diethylene glycol dimethyl ether, diethylene glycol methyl ethyl ether, diethylene glycol diethyl ether, tetrahydrofuran, and a combination of the solvents.

Specific examples of the ketone include methyl ethyl ketone, cyclohexanone, 2-heptanone, 3-heptanone, and a combination of the solvents.

Specific examples of the alkyl lactate include methyl 2-hydroxypropionate, ethyl 2-hydroxypropionate, and a combination of the solvents.

Specific examples of the other esters include methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate (EEP), ethyl ethoxyacetate, ethyl hydroxyacetate, methyl 2-hydroxy-3-methylbutyrate, 3-methyl-3-methoxybutyl acetate, 3-methyl-3-methoxybutylpropionate, ethyl acetate, n-propyl acetate, isopropylacetate, n-butyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-oxybutyrate, and a combination of the solvents.

Specific examples of the aromatic hydrocarbon compound include toluene, xylene, and a combination of the solvents.

Specific examples of the carboxylic acid amide include N-methylpyrrolidone, N,N-dimethyl formamide, N,N-dimethyl acetamide, and a combination of the solvents.

The organic solvent (E) is preferably propylene glycol monomethyl ether acetate, EEP, or a combination of the solvents. The organic solvent (E) can be used alone or in a combination of two or more.

Based on a usage amount of 100 parts by weight of the alkali-soluble resin (B), the usage amount of the organic solvent (E) can be 500 parts by weight to 5000 parts by weight, preferably 800 parts by weight to 4500 parts by weight, and more preferably 1000 parts by weight to 4000 parts by weight.

Additive (F)

Under the premise of not affecting the efficacy of the invention, the photosensitive resin composition of the invention can further optionally include an additive (F). Specific examples of the additive (F) include a surfactant, a filler, a polymer (other than the alkali-soluble resin (B)), an adhesion promoter, an antioxidant, an ultraviolet absorber, and an anticoagulant.

The surfactant helps to improve the coating properties of the photosensitive resin composition. The surfactant is, for instance, a polyoxyethylene alkyl ether such as polyoxyethylene lauryl ether, polyoxyethylene stearyl ether, or polyoxyethylene oleyl ether; a polyoxyethylene alkyl phenyl ether such as polyoxyethylene octyl phenyl ether or polyoxyethylene nonyl phenyl ether; a polyethylene glycol dialkyl ester such as polyethylene glycol dilaurate or polyethylene glycol distearate; a sorbitan fatty acid ester; a fatty acid-modified polyester; a tertiary amine-modified polyurethane; or KP manufactured by Shin-Etsu Chemical Co., Ltd., SF-8427 manufactured by Dow Corning Toray Co., Ltd., Polyflow manufactured by Kyoei-Sha Yushi Kagaku Kogyo Co., Ltd., F-Top manufactured by Tochem Products Co., Ltd., Megafac manufactured by Dainippon Ink & Chemicals, Inc., Fluorade manufactured by Sumitomo 3M Co., Ltd., Asahi Guard manufactured by Asahi Glass, or Surflon manufactured by Asahi Glass Co., Ltd.

Specific examples of the filler include, for instance, glass and aluminum.

Specific examples of the polymer include polyvinyl alcohol, polyethylene glycol monoalkyl ether, polyfluoro alkyl acrylate, and a combination of the polymers.

Specific examples of the adhesion promoter include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxy propyltrimethoxysilane, 3-glycidyloxy propylmethyldimethoxysilane, 2-(3,4-epoxycyclohexyl)ethyltrimethoxysilane, 3-chloropropylmethyl dimethoxysilane, 3-chloropropyltrimethoxysilane, 3-methacryloyloxypropyltrimethoxysilane, 3-mercaptopropyltrimethoxysilane, and a combination of the compounds.

Specific examples of the antioxidant include 2,2-thiobis(4-methyl-6-t-butylphenol), 2,6-di-t-butylphenol, and a combination of the compounds.

Specific examples of the ultraviolet absorber include 2-(3-t-butyl-5-methyl-2-hydroxyphenyl)-5-chlorophenylazide, alkoxy phenone, and a combination of the compounds.

Specific examples of the anti-coagulant include, for instance, sodium polyacrylate.

Based on a usage amount of 100 parts by weight of the alkali-soluble resin (B), the usage amount of the additive (F) is 1 part by weight to 10 parts by weight, preferably 1.5 parts by weight to 8 parts by weight, and more preferably 2 parts by weight to 6 parts by weight.

<Method for Preparing Photosensitive Resin Composition for Color Filter>

A method that can be used to prepare the photosensitive resin composition includes, for instance: placing and stirring the pigment (A), the alkai-soluble resin (B), the compound (C) containing an ethylenically unsaturated group, the photoinitiator (D), and the organic solvent (E) in a stirrer such that the compositions are uniformly mixed into a solution state. When needed, the additive (F) can also be added. After the compositions are uniformly mixed, a photosensitive resin composition in a solution state can be obtained.

In addition, the method for preparing the photosensitive resin composition is not particularly limited. The method for preparing the photosensitive resin composition includes, for instance, first dispersing a portion of the alkali-soluble resin (B) and the compound (C) containing an ethylenically unsaturated group in a portion of the organic solvent (E) to form a dispersion solution, and then mixing the rest of the pigment (A), the alkali-soluble resin (B), the compound (C) containing an ethylenically unsaturated group, the photoinitiator (D), and the organic solvent (E).

Alternatively, the photosensitive resin composition can also be prepared by first dispersing a portion of the pigment (A) in a mixture composed of a portion of the alkali-soluble resin (B) and a portion of the organic solvent (E) to form a pigment dispersion solution, and then mixing the rest of the pigment (A), the alkali-soluble resin (B), the compound (C) containing an ethylenically unsaturated group, the photoinitiator (D), and the organic solvent (E). Moreover, the dispersion steps of the pigment (A) can be performed by mixing with a mixer such as a beads mill or a roll mill.

<Method for Preparing Pixel Layer and Color Filter>

The color filter is obtained by applying the treatments of pre-bake, exposure, development, and post-bake to a substrate with a black matrix formed thereon with the photosensitive resin composition for a color filter in sequence, wherein the black matrix is used to isolate each of the pixel layers (the pixel layer is also referred to as a pixel color layer in the following). The method for preparing the color filter is described below.

First, the photosensitive resin composition in a solution state for a color filter is uniformly coated on a substrate by a coating method such as spin coating, cast coating, or roll coating to form a coating film. The substrate is, for instance, a glass for a liquid crystal display apparatus such as alkali-free glass, soda-lime glass, hard glass (Pyrex glass), quartz glass, or a glass attached with a transparent conductive film; a substrate (such as a silicon substrate) for a photoelectric conversion apparatus (such as a solid-state imaging apparatus); or a substrate with a light-shielding black matrix capable of isolating, for instance, red, green, and blue pixel color layers formed thereon.

After the coating layer is formed, most of the solvent is removed by drying under reduced pressure. Next, the remaining solvent is completely removed by a pre-bake method to form a pre-baked coating film. It should be mentioned that, the conditions for drying under reduced pressure and pre-bake vary according to the type and the ratio of each composition. Generally, drying under reduced pressure is performed at a pressure of 0 mmHg to 200 mmHg for 1 second to 60 seconds, and the pre-bake is a heat treatment performed on the coating film at a temperature of 70° C. to 110° C. for 1 minute to 15 minutes.

Then, the pre-baked coating film is exposed with a photomask having a specific pattern. The light used in the exposure process is preferably an ultraviolet light such as a g-ray, an h-ray, or an i-ray. In addition, the ultra violet light irradiation apparatus can be a(n) (ultra-)high pressure mercury vapor lamp or a metal halide lamp.

Then, the exposed pre-baked coating film is immersed in a developing solution at a temperature of 23±2° C. to remove the unwanted portion of the pre-baked coating film so as to form a specific pattern on the substrate. Specific examples of the developing solution include an alkali aqueous solution of an alkali compound such as sodium hydroxide, potassium hydroxide, sodium carbonate, sodium hydrogen carbonate, potassium carbonate, potassium hydrogen carbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, or 1,8-diazabicyclo-(5,4,0)-7-undecene. The concentration of the developing solution is 0.001 wt % to 10 wt %, preferably 0.005 wt % to 5 wt %, and more preferably 0.01 wt % to 1 wt %.

After the pre-baked coating film is developed, the substrate having a specific pattern is rinsed with water, and then the specific pattern is air dried with compressed air or compressed nitrogen. Then, a post-bake treatment is performed with a heating apparatus such as a hot plate or an oven. The post-bake temperature is generally 150 to 250° C., wherein the heating time when using the hot plate is 5 minutes to 60 minutes and the heating time when using the oven is 15 minutes to 150 minutes. After the treatment steps, a specific pattern can be fixed, thereby forming a pixel color layer. The steps are repeated to form, for instance, red, green, and blue pixel color layers on the substrate in sequence.

Lastly, an ITO protective film (evaporated film) is formed on the surface of the pixel color layers via sputtering in a vacuum environment at a temperature of 220° C. to 250° C. When needed, the ITO protective film is etched and wired, and a liquid crystal alignment film (polyimide for a liquid crystal alignment film) is coated on the surface of the ITO protective film to form a color filter having a pixel layer.

<Method for Manufacturing Liquid Crystal Display Apparatus>

First, the color filter formed by the method for forming a color filter and a substrate provided with a thin film transistor (TFT) are disposed opposite to each other, and a gap (cell gap) is left between the two. Then, the color filter and the peripheral portion of the substrate are adhered with an adhesive and an injection hole is left. Then, liquid crystal is injected into the gap separated by the substrate surface and the adhesive through the injection hole. Lastly, the injection hole is sealed to form a liquid crystal layer. Then, a polarizer is provided to each of the other side of the color filter in contact with the liquid crystal layer and the other side of the substrate in contact with the liquid crystal layer to fabricate a liquid crystal display. The liquid crystal used, i.e., a liquid crystal compound or a liquid crystal composition, is not particularly limited, and any liquid crystal compound or liquid crystal composition can be used.

Moreover, the liquid crystal alignment film used in the fabrication of the color filter is used to limit the alignment of the liquid crystal molecules and is not particularly limited.

Both inorganic matter and organic matter can be used, and the invention is not limited thereto.

Preparation Examples of Diol Compound (b-1) Containing a Polymeric Unsaturated Group Preparation example 1 to preparation example 6 of the diol compound (b-1) containing a polymeric unsaturated group are described below:

Preparation Example 1

First, 100 parts by weight of a fluorene epoxy compound (model number ESF-300, manufactured by Nippon Steel Chemical Co., Ltd., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol monomethyl ether acetate were added in a 500 ml four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Then, steps such as extraction, filtration, and heating and drying were performed on the light yellow transparent mixture solution to obtain a diol compound (b-1-1) containing a polymeric unsaturated group of preparation example 1 having a solid content of 99.9 wt %.

Preparation example 2

First, 100 parts by weight of a fluorene epoxy compound (model number PG-100, manufactured by Osaka Gas, epoxy equivalent 259), 35 parts by weight of methacrylic acid, 0.3 parts by weight of benzyltriethylammonium chloride, 0.1 parts by weight of 2,6-di-t-butyl-p-cresol, and 135 parts by weight of propylene glycol monomethyl ether acetate were added in a 500 ml four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps such as extraction, filtration, and heating and drying were performed on the light yellow transparent mixture solution to obtain a diol compound (b-1-2) containing a polymeric unsaturated group of preparation example 2 having a solid content of 99.9 wt %.

Preparation Example 3

100 parts by weight of a fluorene epoxy compound (model number ESF-300, manufactured by Nippon Steel Chemical Co., Ltd., epoxy equivalent 231), 100 parts by weight of 2-methacryloyl oxyethyl succinate monoester, 0.3 parts by weight of benzyltriethylammonium chloride, 0.1 parts by weight of 2,6-di-t-butyl-p-cresol, and 200 parts by weight of propylene glycol monomethyl ether acetate were added in a 500 ml four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps such as extraction, filtration, and heating and drying were performed on the light yellow transparent mixture solution to obtain a diol compound (b-1-3) containing a polymeric unsaturated group of preparation example 3 having a solid content of 99.9 wt %.

Preparation Example 4

First, 0.3 moles of bis(4-hydroxyphenyl)sulfone, 9 moles of epichlorohydrin, and 0.003 moles of tetramethyl ammonium chloride were added in a 1000 mL three-neck flask provided with a mechanical stirrer, a thermometer, and a reflux condenser. Next, the flask was heated to 105° C. while stirring and reacted at 105° C. for 9 hours. Then, unreacted epichlorohydrin was distilled under reduced pressure. Next, the reaction system was cooled to room temperature and 9 moles of benzene and 0.5 moles of sodium hydroxide (a 30 wt % aqueous solution formed by dissolving in water) were added thereto while stirring. Then, the temperature was raised to 60° C. and maintained at 60° C. for 3 hours. Next, the reaction solution was washed with water repeatedly until no chloride ions remained (tested with silver nitrate.) The solvent benzene was removed via distillation under reduced pressure, and then the reaction solution was dried at 75° C. for 24 hours to obtain an epoxy compound of bis(4-hydroxyphenyl)sulfone.

100 parts by weight of an epoxy compound (epoxy equivalent 181) of bis(4-hydroxyphenyl)sulfone, 30 parts by weight of acrylic acid, 0.3 parts by weight of benzyltriethylammonium chloride, 0.1 parts by weight of 2,6-di-t-butyl-p-cresol, and 130 parts by weight of propylene glycol monomethyl ether acetate were added in a 500 ml four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps such as extraction, filtration, and heating and drying were performed on the light yellow transparent mixture solution to obtain a diol compound (b-1-4) containing a polymeric unsaturated group of preparation example 4 having a solid content of 99.9 wt %.

Preparation Example 5

0.3 moles of bis(4-hydroxyphenyl)hexafluoropropane, 9 moles of epichlorohydrin, and 0.003 moles of tetramethyl ammonium chloride were added in a 1000 mL three-neck flask provided with a mechanical stirrer, a thermometer, and a reflux condenser. Next, the flask was heated to 105° C. while stirring and reacted at 105° C. for 9 hours. Then, unreacted epichlorohydrin was distilled under reduced pressure. Next, the reaction system was cooled to room temperature and 9 moles of benzene and 0.5 moles of sodium hydroxide (a 30 wt % aqueous solution formed by dissolving in water) were added thereto while stirring. Then, the temperature was raised to 60° C. and maintained at 60° C. for 3 hours. Next, the reaction solution was washed with water repeatedly until no chloride ions remained (tested with silver nitrate.) The solvent benzene was removed via distillation under reduced pressure, and then the reaction solution was dried at 75° C. for 24 hours to obtain an epoxy compound of bis(4-hydroxyphenyl)hexafluoropropane.

100 parts by weight of the epoxy compound (epoxy equivalent 224) of bis(4-hydroxyphenyl)hexafluoropropane, 35 parts by weight of methacrylic acid, 0.3 parts by weight of benzyltriethylammonium chloride, 0.1 parts by weight of 2,6-di-t-butyl-p-cresol, and 135 parts by weight of propylene glycol monomethyl ether acetate were added in a 500 ml four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps such as extraction, filtration, and heating and drying were performed on the light yellow transparent mixture solution to obtain a diol compound (b-1-5) containing a polymeric unsaturated group of preparation example 5 having a solid content of 99.9 wt %.

Preparation Example 6

0.3 moles of bis(4-hydroxyphenyl)dimethylsilane, 9 moles of epichlorohydrin, and 0.003 moles of tetramethyl ammonium chloride were added in a 1000 mL three-neck flask provided with a mechanical stirrer, a thermometer, and a reflux condenser. Next, the flask was heated to 105° C. while stirring and reacted at 105° C. for 9 hours. Then, unreacted epichlorohydrin was distilled under reduced pressure. Next, the reaction system was cooled to room temperature and 9 moles of benzene and 0.5 moles of sodium hydroxide (a 30 wt % aqueous solution formed by dissolving in water) were added thereto while stirring. Then, the temperature was raised to 60° C. and maintained at 60° C. for 3 hours. Next, the reaction solution was washed with water repeatedly until no chloride ions remained (tested with silver nitrate.) The solvent benzene was removed via distillation under reduced pressure, and then the reaction solution was dried at 75° C. for 24 hours to obtain an epoxy compound of bis(4-hydroxyphenyl)dimethylsilane.

100 parts by weight of the epoxy compound (epoxy equivalent 278) of bis(4-hydroxyphenyl)dimethylsilane, 100 parts by weight of 2-methacryloyl oxyethyl succinate monoester, 0.3 parts by weight of benzyltriethylammonium chloride, 0.1 parts by weight of 2,6-di-t-butyl-p-cresol, and 200 parts by weight of propylene glycol monomethyl ether acetate were added in a 500 ml four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps such as extraction, filtration, and heating and drying were performed on the light yellow transparent mixture solution to obtain a diol compound (b-1-6) containing a polymeric unsaturated group of preparation example 6 having a solid content of 99.9 wt %.

Synthesis Examples of First Alkai-Soluble Resin (B-1)

In the following, synthesis example 1 to synthesis example 10 of the first alkali-soluble resin (B-1) are described:

Synthesis Example 1

1.0 mole of the diol compound (b-1) containing a polymeric unsaturated group, 1.9 grams of benzyltriethylammonium chloride, and 0.6 grams of 2,6-di-tert-butyl-p-cresol were dissolved in 900 grams of ethylene glycol monoethyl ether, and 0.2 moles of 3,3',4,4'-biphenyl tetracarboxylic dianhydride (b-2-1) and 1.6 moles of trimethoxysilylpropyl succinic anhydride (b-3-1) were added at the same time (simultaneous addition; here, "simultaneous addition" refers to adding 3,3',4,4'-biphenyl tetracarboxylic dianhydride (b-2-1) and trimethoxysilylpropyl succinic anhydride (b-3-1) at the same reaction time) to form a reaction solution. Then, the reaction solution was heated to 110° C. and reacted for 2 hours to obtain the first alkali-soluble resin (referred to as first alkali-soluble resin B-1-1 below) of synthesis example 1 having an acid value of 100 mgKOH/g and a number-average molecular weight of 1566.

Synthesis Example 2

1.0 mole of the diol compound (b-1-2) containing a polymeric unsaturated group, 2.0 grams of triphenylphosphine, and 0.7 grams of methoxyphenol were dissolved in 900 grams of ethylene glycol monoethyl ether. Then, 0.3 moles of 3,3',4,4'-benzophenone tetracarboxylic dianhydride (b-2-2) was added, and the mixture was reacted at 90° C. for 2 hours. Next, 1.4 moles of triethoxysilylpropyl succinic anhydride (b-3-2) was added, and the mixture was reacted at 90° C. for 4 hours (successive addition; here, "successive addition" refers to respectively adding 3,3',4,4'-benzophenone tetracarboxylic dianhydride (b-2-2) and triethoxysilylpropyl succinic anhydride (b-3-2) at different reaction times.) That is, 3,3',4,4'-benzophenone tetracarboxylic dianhydride (b-2-2) was added first, and then triethoxysilylpropyl succinic anhydride (b-3-2) was added thereafter. In this way, the first alkali-soluble resin (referred to as first alkali-soluble resin B-1-2 below) of synthesis example 2 having an acid value of 90 mgKOH/g and a number-average molecular weight of 1981 can be obtained.

Synthesis Example 3 to Synthesis Example 10

The first alkali-soluble resins of synthesis example 3 to synthesis example 10 were prepared with the same steps as synthesis example 2, and the difference is: the type, the usage amount, the reaction time, the reaction temperature, and the addition time of the reactants of each of the compositions of the first alkali-soluble resins were changed (as shown in Table 1), wherein the compounds corresponding to the labels in Table 1 are as follows.

| Abbreviation | Composition |
| --- | --- |
| b-2-1 | 3,3',4,4'-biphenyl tetracarboxylic dianhydride |
| b-2-2 | 3,3',4,4'-benzophenone tetracarboxylic dianhydride |
| b-2-3 | 3,3',4,4'-oxydiphenyl tetracarboxylic dianhydride |
| b-3-1 | trimethoxysilylpropyl succinic anhydride |
| b-3-2 | triethoxysilylpropyl succinic anhydride |
| b-3-3 | methyldimethoxysilylpropyl succinic anhydride |
| b-3-4 | methyldiethoxysilylpropyl succinic anhydride |
| b-4-1 | butanedioic anhydride |
| b-4-2 | phthalic anhydride |
| PGMEA | propylene glycol monomethyl ether acetate |
| EEP | ethyl 3-ethoxypropionate |
| — | benzyltriethylammonium chloride |
| — | triphenylphosphine |
| — | tris(2,6-dimethoxyphenyl)phosphine |
| — | 2,6-di-tert-butyl-p-cresol |
| — | methoxyphenol |
| — | methylhydroquinon |

TABLE 1

| Composition | | | 1 B-1-1 | 2 B-1-2 | 3 B-1-3 | 4 B-1-4 | 5 B-1-5 | 6 B-1-6 | 7 B-1-7 | 8 B-1-8 | 9 B-1-9 | 10 B-1-10 |
|---|---|---|---|---|---|---|---|---|---|---|---|---|
| Composition for polymerization | Composition (b-1) | b-1-1 | 1.0 | — | — | 1.0 | — | — | — | — | — | 1.0 |
| | | b-1-2 | — | 1.0 | — | — | 1.0 | 0.5 | — | — | — | — |
| | | b-1-3 | — | — | 1.0 | — | — | 0.5 | — | — | — | — |
| | | b-1-4 | — | — | — | — | — | — | — | 1.0 | — | — |
| | | b-1-5 | — | — | — | — | — | — | — | — | 1.0 | — |
| | | b-1-6 | — | — | — | — | — | — | — | — | 1.0 | — |
| | Composition (b-2) | b-2-1 | 0.2 | — | — | 0.5 | — | — | 0.4 | — | — | 0.5 |
| | | b-2-2 | — | 0.3 | — | — | 0.6 | — | 0.4 | 1.0 | — | — |
| | | b-2-3 | — | — | 0.4 | — | — | 0.7 | — | — | 0.15 | — |
| | Composition (b-3) | b-3-1 | 1.6 | — | — | — | — | — | 0.3 | — | — | — |
| | | b-3-2 | — | 1.4 | — | — | 0.5 | — | — | 0.02 | — | — |
| | | b-3-3 | — | — | 1.2 | 0.5 | — | 0.3 | — | — | 1.5 | — |
| | | b-3-4 | — | — | — | 0.5 | — | — | 0.1 | — | — | 0.01 |
| | Composition (b-4) | b-4-1 | — | — | — | — | 0.3 | — | — | — | — | — |
| | | b-4-2 | — | — | — | — | 0.3 | — | — | — | — | — |
| Monomer input method | | | simultaneous addition | successive addition | simultaneous addition | successive addition | simultaneous addition | successive addition | simultaneous addition | successive addition | simultaneous addition | successive addition |
| Catalyst (grams) | benzyltriethylammonium chloride | | 1.9 | — | — | 1.0 | — | 1.4 | 1.1 | — | — | 1.0 |
| | triphenylphosphine | | — | 2.0 | — | 0.9 | 1.0 | — | — | 1.3 | — | 0.5 |
| | tris(2,6-dimethoxyphenyl)phosphine | | — | — | 2.9 | — | 1.0 | 1.0 | — | — | 1.1 | 0.4 |
| Inhibitor (grams) | 2,6-di-t-butyl-p-cresol | | 0.6 | — | — | 0.3 | — | 0.3 | 0.4 | — | — | 0.1 |
| | methoxyphenol | | — | 0.7 | — | 0.3 | 0.6 | — | — | 0.4 | — | 0.2 |
| | methylhydroquinone | | — | — | 1.0 | — | — | 0.1 | 0.5 | — | 0.4 | 0.3 |
| Solvent (grams) | PGMEA | | 900 | 900 | 1000 | 800 | — | 900 | 600 | 600 | 600 | 600 |
| | EEP | | — | — | 100 | — | 800 | — | — | — | — | — |
| (b-2)/(b-1) | | | 0.2 | 0.3 | 0.4 | 0.5 | 0.6 | 0.7 | 0.8 | 1.0 | 0.15 | 0.5 |
| (b-3)/(b-1) | | | 1.6 | 1.4 | 1.2 | 1.0 | 0.5 | 0.3 | 0.4 | 0.02 | 1.5 | 0.01 |
| Reaction temperature (° C.) | | | 110 | 90 | 115 | 95 | 110 | 90 | 115 | 95 | 110 | 90 |
| Reaction time (hours) | | | 2 | 2 4 | 1.5 | 1.5 4 | 2 | 2 3.5 | 1.5 | 2 3.5 | 2 | 2 4 |
| Acid value (mgKOH/g) | | | 100 | 90 | 80 | 110 | 110 | 90 | 150 | 140 | 130 | 70 |
| Number-average molecular weight (Mn) | | | 1566 | 1981 | 2412 | 2885 | 3050 | 3527 | 3964 | 4582 | 1395 | 3005 |

Synthesis Examples of Second Alkai-Soluble Resin (B-2)

In the following, synthesis example 11 to synthesis example 13 of the second alkali-soluble resin (B-2) are described:

Synthesis Example 11

1.0 mole of the diol compound (b-1) containing a polymeric unsaturated group, 1.9 grams of benzyltriethylammonium chloride, and 0.6 grams of 2,6-di-tert-butyl-p-cresol were dissolved in 700 grams of ethylene glycol monoethyl ether, and 0.3 moles of 3,3',4,4'-biphenyl tetracarboxylic dianhydride (b-2-1) and 1.4 moles of succinic anhydride (b-4-1) were added at the same time. Then, the mixture was heated to 110° C. and reacted for 2 hours to obtain the second alkali-soluble resin (referred to as second alkali-soluble resin B-2-1 below) of synthesis example 11 having an acid value of 130 mgKOH/g and a number-average molecular weight of 1888.

Synthesis Example 12 to Synthesis Example 13

The second alkali-soluble resins of synthesis example 12 to synthesis example 13 were prepared with the same steps as synthesis example 17, and the difference is: the type, the usage amount, the reaction time, the reaction temperature, and the addition time of the reactants of each of the compositions of the second alkali-soluble resins were changed (as shown in Table 2).

TABLE 2

| Composition | | | Synthesis example | | |
|---|---|---|---|---|---|
| | | | 11 B-2-1 | 12 B-2-2 | 13 B-2-3 |
| Composition (b-1) for polymerization | Composition (b-1) | b-1-1 | 1.0 | — | — |
| | | b-1-2 | — | 1.0 | — |
| | | b-1-3 | — | — | 1.0 |
| | | b-1-4 | — | — | — |
| | | b-1-5 | — | — | — |
| | | b-1-6 | — | — | — |
| | Composition (b-2) | b-2-1 | 0.3 | — | — |
| | | b-2-2 | — | 0.4 | — |
| | | b-2-3 | — | — | 0.5 |
| | Composition (b-3) | b-3-1 | — | — | — |
| | | b-3-2 | — | — | — |
| | | b-3-3 | — | — | — |
| | | b-3-4 | — | — | — |
| | Composition (b-4) | b-4-1 | 1.4 | — | 1.0 |
| | | b-4-2 | — | 1.2 | — |
| Monomer input method | | | simultaneous addition | successive addition | simultaneous addition |
| Catalyst (grams) | benzyltriethyl-ammoniumchloride | | 1.9 | — | — |
| | triphenylphosphine | | — | 2.0 | — |
| | tris(2,6-dimethoxy-phenyl) phosphine | | — | — | 2.9 |
| Inhibitor (grams) | 2,6-di-t-butyl-p-cresolmethoxyphenol | | 0.6 | — | — |
| | methoxyphenol | | — | 0.7 | — |
| | methylhydroquinone | | — | — | 1.0 |
| Solvent (grams) | PGMEA | | 700 | 800 | 900 |
| | EEP | | — | — | — |
| (b-2)/(b-1) | | | 0.3 | 0.4 | 0.5 |
| (b-3)/(b-1) | | | — | — | — |
| Reaction temperature (° C.) | | | 110 | 90 | 115 |
| Reaction time (hours) | | | 2 | 24 | 2 |
| Acid value (mgKOH/g) | | | 130 | 120 | 90 |
| Number-average molecular weight (Mn) | | | 1888 | 2340 | 3210 |

Synthesis Example 14

50 wt % of a propylene glycol monomethyl ether acetate solution of the equivalent reactants of 198.53 grams of a fluorene bisphenol epoxy resin and acrylic acid (manufactured by Nippon Steel Chemical Company, ASF-400 solution, solid content 50 wt %, acid value 1.28 mgKOH/g in solid content equivalent, epoxy equivalent 21300), 24.15 grams of benzophenone tetracarboxylic dianhydride, 8.13 grams of succinic anhydride, 48.12 grams of propylene glycol monomethyl ether acetate, and 0.45 grams of triphenylphosphine were added in a 500 mL four-neck flask equipped with a reflux condenser. Next, the mixture was heated and stirred at 120° C. to 125° C. for 1 hour. Then, the mixture was heated and stirred at 75° C. to 80° C. for 6 hours. Next, 7.14 grams of 3-glycidoxypropyltrimethoxysilane was added, and the mixture was stirred at 80° C. for 8 hours to synthesize a second alkali-soluble resin (B-2-4). The solid content of the obtained resin solution is 53.2 wt %, and the acid value (in solid content equivalent) is 110 mgKOH/g. The area % of the second alkali-soluble resin (B-2-4) in the resin solution is analyzed by GPC to be 91%, and the number average molecular weight is 6621.

Examples of Photosensitive Resin

Example 1 to example 10 and comparative example 1 to comparative example 7 of the photosensitive resin are described below:

Example 1

40 parts by weight of the first pigment (A-1) (hereinafter A-1) represented by formula (1), 100 parts by weight of the first alkali-soluble resin (B-1-1), 40 parts by weight of KAYARAD TPA-330 (manufactured by Nippon Kayaku Co., Ltd.; hereinafter C-1-2), 5 parts by weight of 2-methyl-1-(4-methylthio phenyl)-2-morpholino-1-propanone (hereinafter D-1), 10 parts by weight of 2,2'-bis(2,4-dichlorophenyl)-4,4',5,5'-tetraphenyl-biimidazole (hereinafter D-2), 5 parts by weight of 4,4'-bis(diethylamino)benzophenone (hereinafter D-3), and 1 part by weight of sodium polyacrylate (hereinafter F-1) were added to 500 parts by weight of ethyl 3-ethoxypropionate (hereinafter E-1). The mixture was uniformly stirred with a shaking type stirrer to obtain the photosensitive resin composition of example 1. The obtained photosensitive resin composition was evaluated by each of the following evaluation methods, and the results are as shown in Table 3.

Example 2 to Example 10

The photosensitive resin composition of each of example 2 to example 10 was prepared using the same steps as example 1, with the difference being: the type and the usage amount of each of the compositions of the photosensitive resin compositions were changed (as shown in Table 3), wherein the compounds corresponding to the labels of Table 3 are as shown below. The obtained photosensitive resin compositions were evaluated by each of the following evaluation methods, and the results are as shown in Table 3.

Comparative Example 1 to Comparative Example 7

The photosensitive resin composition of each of comparative example 1 to comparative example 7 was prepared using the same steps as example 1, with the difference being: the type and the usage amount of each of the compositions of the photosensitive resin compositions were changed (as shown in Table 4), wherein the compounds corresponding to the labels of Table 4 are as shown below. The obtained photosensitive resin compositions were evaluated by each of the following evaluation methods, and the results are as shown in Table 4.

| Abbreviation | Composition |
|---|---|
| A-1 | Compound represented by formula (1) |
| A-2-1 | C.I. pigment red 254 |
| A-2-2 | C.I. pigment yellow 180 |
| A-2-3 | C.I. pigment orange 71 |
| C-1-1 | KAYARAD DPEA-12 (manufactured by Nippon Kayaku Co., Ltd., Japan) |
| C-1-2 | KAYARAD TPA-330 (manufactured by Nippon Kayaku Co., Ltd., Japan) |
| C-2-1 | KAYARAD DPCA-20 (manufactured by Nippon Kayaku Co., Ltd., Japan) |
| C-2-2 | KAYARAD DPCA-60 (manufactured by Nippon Kayaku Co., Ltd., Japan) |
| C-3-1 | dipentaerythritol hexaacrylate |
| C-3-2 | trimethylolpropane triacrylate |
| D-1 | 2-methyl-1-(4-methylthio phenyl)-2-morpholino-1-propanone |
| D-2 | 2,2'-bis(2,4-dichlorophenyl)-4,4',5,5'-tetraphenyl-biimidazole |
| D-3 | 4,4'-bis(diethylamino)benzophenone |
| D-4 | 1-(4-phenyl-thio-phenyl)-octane-1,2-dion-2-oxime-O-benzoate (delete) |
| E-1 | ethyl 3-ethoxypropionate |
| E-2 | propylene glycol monomethyl ether acetate |
| F-1 | sodium polyacrylate |
| F-2 | alkoxy phenone |

TABLE 3

| Composition | | | Example 1 | 2 | 3 | 4 | 5 | 6 | 7 | 8 | 9 | 10 |
|---|---|---|---|---|---|---|---|---|---|---|---|---|
| Pigment (A) (parts by weight) | A-1 | | 40 | 80 | 160 | 240 | 320 | 400 | 40 | 100 | 300 | 400 |
| | A-2 | A-2-1 | — | — | — | — | — | — | 20 | — | — | 200 |
| | | A-2-2 | — | — | — | — | — | — | — | 30 | 50 | — |
| | | A-2-3 | — | — | — | — | — | — | — | — | 50 | — |
| Alkali-soluble resin (B) (parts by weight) | B-1 | B-1-1 | 100 | — | — | — | — | — | — | — | — | — |
| | | B-1-2 | — | 100 | — | — | — | — | — | — | — | — |
| | | B-1-3 | — | — | 100 | — | — | — | — | — | — | — |
| | | B-1-4 | — | — | — | 100 | 50 | — | — | — | — | — |
| | | B-1-5 | — | — | — | — | 50 | — | — | — | — | — |
| | | B-1-6 | — | — | — | — | — | 70 | — | — | — | — |
| | | B-1-7 | — | — | — | — | — | — | 50 | — | — | — |
| | | B-1-8 | — | — | — | — | — | — | — | 10 | — | — |
| | | B-1-9 | — | — | — | — | — | — | — | — | 100 | — |
| | | B-1-10 | — | — | — | — | — | — | — | — | — | 100 |
| | B-2 | B-2-1 | — | — | — | — | — | 30 | — | — | — | — |
| | | B-2-2 | — | — | — | — | — | — | 50 | — | — | — |
| | | B-2-3 | — | — | — | — | — | — | — | 90 | — | — |
| | (B-1):(B-2) | | 100:0 | 100:0 | 100:0 | 100:0 | 100:0 | 70:30 | 50:50 | 10:90 | 100:0 | 100:0 |
| Compound (C) containing an ethylenically unsaturated group (parts by weight) | C-1 | C-1-1 | — | — | 5 | — | — | — | — | — | — | — |
| | | C-1-2 | 40 | — | — | 60 | — | — | — | — | — | — |
| | C-2 | C-2-1 | — | 60 | — | — | 5 | — | — | — | — | — |
| | | C-2-2 | — | — | 30 | 10 | — | — | — | — | — | — |
| | C-3 | C-3-1 | — | 50 | — | 150 | — | 300 | — | 50 | 250 | — |
| | | C-3-2 | — | — | 100 | — | 250 | — | 100 | 150 | 50 | 400 |
| Photoinitiator (D) (parts by weight) | D-1 | | 5 | 10 | — | 20 | 30 | — | 10 | 10 | 40 | 50 |
| | D-2 | | 10 | 20 | 30 | 20 | 30 | 20 | 20 | — | 40 | — |
| | D-3 | | 5 | — | — | — | — | 20 | — | 30 | — | 30 |
| | D-4 | | — | — | 10 | 10 | — | 30 | — | 10 | — | 20 |
| Organic solvent (E) (parts by weight) | E-1 | | 500 | — | 1500 | 2000 | 2500 | 3500 | — | 2000 | 3000 | 5000 |
| | E-2 | | — | 1000 | — | — | — | — | 1000 | 1000 | 1000 | — |
| Additive (F) (parts by weight) | F-1 | | 1 | — | — | — | — | — | — | — | — | 10 |
| | F-2 | | — | — | — | — | 5 | — | — | — | — | — |
| Evaluation results | Contrast | | ○ | ○ | ○ | ○ | ○ | ○ | ◎ | ◎ | ◎ | ◎ |
| | post-baking color difference | | ◎ | ◎ | ◎ | ◎ | ◎ | ◎ | ◎ | ◎ | ◎ | ◎ |
| | Linearity of high precision pattern | | ☆ | ☆ | ☆ | ☆ | ☆ | ◎ | ◎ | ◎ | ○ | ○ |

TABLE 4

| Composition | | | Comparative example 1 | 2 | 3 | 4 | 5 | 6 | 7 |
|---|---|---|---|---|---|---|---|---|---|
| Pigment (A) (parts by weight) | A-1 | | — | 100 | 150 | 200 | 250 | — | — |
| | A-2 | A-2-1 | 100 | — | — | 50 | — | 100 | 150 |
| | | A-2-2 | — | — | — | — | 100 | — | 50 |
| | | A-2-3 | — | — | — | — | — | — | — |
| Alkali-soluble resin (B) (parts by weight) | B-1 | B-1-1 | 100 | — | — | — | — | — | — |
| | | B-1-2 | — | — | — | — | — | — | — |
| | | B-1-3 | — | — | — | — | — | — | — |
| | | B-1-4 | — | — | — | — | — | — | — |
| | | B-1-5 | — | — | — | — | — | — | — |
| | | B-1-6 | — | — | — | — | — | — | — |
| | | B-1-7 | — | — | — | — | — | — | — |
| | | B-1-8 | — | — | — | — | — | — | — |
| | | B-1-9 | — | — | — | — | — | — | — |
| | | B-1-10 | — | — | — | — | — | — | — |
| | | B-2-1 | — | 100 | — | — | 100 | — | — |
| | B-2 | B-2-2 | — | — | 100 | — | — | 100 | — |
| | | B-2-3 | — | — | — | 100 | — | — | 100 |
| | (B-1):(B-2) | | 100:0 | 0:100 | 0:100 | 0:100 | 0:100 | 0:100 | 0:100 |
| Compound (C) containing an ethylenically unsaturated | C-1 | C-1-1 | 50 | — | — | 60 | — | — | — |
| | | C-1-2 | — | 60 | — | — | — | — | — |
| | C-2 | C-2-1 | 50 | — | — | — | 60 | — | — |
| | | C-2-2 | — | — | 60 | — | — | — | — |
| | C-3 | C-3-1 | — | 50 | — | 150 | — | 150 | — |

TABLE 4-continued

| Composition | | Comparative example | | | | | | |
|---|---|---|---|---|---|---|---|---|
| | | 1 | 2 | 3 | 4 | 5 | 6 | 7 |
| group (parts by weight) | C-3-2 | 50 | | 100 | | 250 | — | 200 |
| Photoinitiator (D) (parts by weight) | D-1 | 10 | 10 | | 20 | 30 | — | 30 |
| | D-2 | 20 | 20 | 30 | 10 | 40 | 10 | 20 |
| | D-3 | 10 | — | — | — | — | 10 | — |
| | D-4 | — | — | 10 | 20 | — | 20 | — |
| Organic solvent (E) (parts by weight) | E-1 | 1000 | — | 2000 | — | 3500 | 500 | 2000 |
| | E-2 | 1000 | 1500 | — | 2500 | — | 1500 | 500 |
| Additive (F) (parts by weight) | F-1 | — | — | — | — | — | — | — |
| | F-2 | — | — | — | — | — | — | — |
| Evaluation results | Contrast | X | ○ | ○ | ○ | ○ | X | X |
| | post-baking color difference | ○ | X | X | X | X | X | X |
| | Linearity of high precision pattern | ○ | X | X | X | X | X | X |

<Evaluation Methods>

Contrast

The photosensitive resin composition of each example and comparative example was coated on a glass substrate having a length and a width of 100 mm with a spin coating method. Then, the glass substrate was dried at a reduced pressure of about 100 mmHg for about 30 seconds. Next, the glass substrate was prebaked at 80° C. for 3 minutes to form a pre-baked coating film having a film thickness of 2.5 μm. Then, the pre-baked coating film was irradiated with 300 mJ/cm² of ultraviolet light with an exposure machine (manufactured by Canon, Model PLA-501F). After the ultraviolet light irradiation, the pre-baked coating film was immersed in a developing solution at 23° C. for 2 minutes. Then, the pre-baked coating film was washed with pure water and post-baked at 200° C. for 80 minutes to form a photosensitive resin layer having a film thickness of 2.0 microns on the glass substrate.

Figure 2:
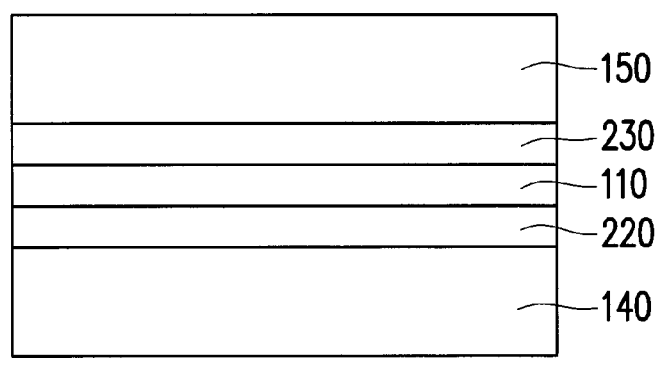
FIG. 2 is a schematic diagram illustrated according to a detection apparatus of contrast in the evaluation methods of the invention.

The brightness value of the photosensitive resin layer having a film thickness of about 2.0 microns was measured with a detection apparatus illustrated in FIG. 1 and FIG. 2, and the ratio of brightness was calculated.

In a detection apparatus 100 of FIG. 1, an obtained photosensitive resin layer 110 was disposed between a first polarizer 120 and a second polarizer 130. The light emitted from a light source 140 passes through the first polarizer 120, the photosensitive resin layer 110, and the second polarizer 130 in sequence. Then, a brightness meter 150 (manufactured by Topcon, Model BM-5A) was used to measure the brightness value (cd/cm²) of the light passing through the second polarizer 130. It should be mentioned that, when the polarization direction of the first polarizer 120 and the polarization direction of the second polarizer 130 are projected on a same plane, the polarization direction of the first polarizer 120 is parallel to the polarization direction of the second polarizer 130 (such as a polarization direction D1). The brightness value measured by the detection apparatus 100 of FIG. 1 is A.

A detection apparatus 200 illustrated in FIG. 2 is substantially the same as the detection apparatus 100 illustrated in FIG. 1, and the difference is, when a polarization direction D2 of a first polarizer 220 and a polarization direction D3 of a second polarizer 230 are projected on a same plane, the polarization direction D2 of the first polarizer 220 is perpendicular to the polarization direction D3 of the second polarizer 230. The brightness value measured by the detection apparatus 200 is B. Then, the contrast of each of the photosensitive resin compositions was calculated with formula (14) and evaluated according to the following criteria.

$$\text{Contrast} = \frac{\text{Brightness value } A}{\text{Brightness value } B} \quad \text{formula (14)}$$

⊚: 1500≤contrast
○: 1200≤contrast<1500
Δ: 900≤contrast<1200
X: contrast<900

Post-Baking Color Difference

Each of the photosensitive resin compositions was coated on a glass substrate having a length and a width of 100 mm with a spin coating method. The glass substrate was dried at a reduced pressure of about 100 mmHg for about 30 seconds. Next, the glass substrate was prebaked at 80° C. for 2 minutes to form a pre-baked coating film having a film thickness of 2.5 μm.

Then, the pre-baked coating film was irradiated with 100 mJ/cm² of ultraviolet light with an exposure machine (manufactured by Canon, Model PLA-501F). After the ultraviolet light irradiation, the pre-baked coating film was immersed in a developing solution at 23° C. After 1 minute, the pre-baked coating film was washed with pure water. Then, the chromaticity (L*, a*, and b*) thereof was measured using a colorimeter (manufactured by Otsuka Electronics Co., Ltd., Model MCPD). Next, the pre-baked coating film was post-baked at 235° C. for 30 minutes to form a photosensitive resin layer having a film thickness of 2.0 microns on the glass substrate. Then, the chromaticity thereof was determined again. The chromaticity variation before post-bake and after post-bake was defined as the post-baking color difference by formula (15), and the post-baking color difference ΔEab* was evaluated according to the following criteria.

$$\Delta Eab^* = [(\Delta L)^2 + (\Delta a)^2 + (\Delta b)^2]^{1/2} \quad \text{formula (15)}$$

⊚: post-baking color difference ΔEab*<2
○: 2≤post-baking color difference ΔEab*<4

Δ: 4≤post-baking color difference ΔEab*<6
X: 6≤post-baking color difference ΔEab*
Linearity of High Precision Pattern The photosensitive resin composition of each example and comparative example was coated on a glass substrate having a length and a width of 100 mm with a spin coating method. Then, the glass substrate was dried at a reduced pressure of about 100 mmHg for about 30 seconds. Next, the glass substrate was prebaked at 80° C. for 3 minutes to form a pre-baked coating film having a film thickness of 2.5 μm. Then, the pre-baked coating film was irradiated with 300 mJ/cm$^2$ of ultraviolet light with an exposure machine (manufactured by Canon, Model PLA-501F) via a photomask having a stripe pattern and a width of 25 microns (pitch of 50 microns). After the ultraviolet light irradiation, the pre-baked coating film was immersed in a developing solution at 23° C. for 2 minutes. Then, the pre-baked coating film was washed with pure water and post-baked at 200° C. for 80 minutes to form a photosensitive resin layer having a film thickness of 2.0 microns on the glass substrate.

The stripe pattern formed by the method above was observed using an optical microscope, and the linearity of high precision pattern was evaluated according to the following criteria.

☆: 90% or more of stripe pattern have good linearity
◎: 80% to 89% of stripe pattern have good linearity
○: 70% to 79% of stripe pattern have good linearity
Δ: 60% to 69% of stripe pattern have good linearity
X: less than 60% of stripe pattern have good linearity <Evaluation Results>

It can be known from Table 3 and Table 4 that, in comparison to the photosensitive resin compositions (comparative example 1, comparative example 6, and comparative example 7) without the first pigment (A-1), the photosensitive resin compositions (example 1 to example 10) containing the first pigment (A-1) have better contrast.

Moreover, in comparison to the photosensitive resin compositions (example 1 to example 6, comparative example 2 and comparative example 3) without the second pigment (A-2), the photosensitive resin compositions (example 7 to example 10) containing the second pigment (A-2) have better contrast.

Moreover, in comparison to the photosensitive resin compositions (comparative example 2 to comparative example 7) containing only the second alkali-soluble resin (B-2), the photosensitive resin compositions (example 1 to example 10) containing the first alkali-soluble resin (B-1) have low post-baking color difference and better linearity of high precision pattern.

Moreover, in comparison to the photosensitive resin compositions (example 1 to example 5, example 9, example 10, and comparative example 1) containing only the first alkali-soluble resin (B-1), the photosensitive resin compositions (example 6 to example 8) containing the second alkali-soluble resin (B-2) have better linearity of high precision pattern.

Moreover, in comparison to the photosensitive resin compositions (example 2, example 5 to example 10, comparative example 3, comparative example 5, comparative example 6, and comparative example 7) without the first compound (C-1), the photosensitive resin compositions (example 1, example 3, and example 4) containing the first compound (C-1) have better linearity of high precision pattern.

Moreover, in comparison to the photosensitive resin compositions (example 1, example 6 to example 10, comparative example 2, comparative example 4, comparative example 6, and comparative example 7) without the second compound (C-2), the photosensitive resin compositions (example 2 to example 5) containing the second compound (C-2) have better linearity of high precision pattern.

Moreover, in comparison to the photosensitive resin composition (example 9) for which the molar ratio (b-2)/(b-1) of the composition (b-1) and the composition (b-2) in the alkali-soluble resin is 0.15, the photosensitive resin compositions (example 1 to example 8) for which the molar ratio (b-2)/(b-1) of the composition (b-1) and the composition (b-2) in the alkali-soluble resin is 0.2 to 1.0 have better linearity of high precision pattern.

Moreover, in comparison to the photosensitive resin composition (example 10) for which the molar ratio (b-3)/(b-1) of the composition (b-1) and the composition (b-3) in the alkali-soluble resin is 0.01, the photosensitive resin compositions (example 1 to example 8) for which the molar ratio (b-3)/(b-1) of the composition (b-1) and the composition (b-3) in the alkali-soluble resin is 0.02 to 1.6 have better linearity of high precision pattern.

Based on the above, since the photosensitive resin composition of the invention contains a specific pigment and a specific alkali-soluble resin, the photosensitive resin composition has the features of good contrast, low post-baking color difference, and good linearity of high precision pattern. As a result, the photosensitive resin composition is suitable for a color filter and a liquid crystal display apparatus.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:
1. A photosensitive resin composition for a color filter, comprising:
a pigment (A);
an alkai-soluble resin (B);
a compound (C) containing an ethylenically unsaturated group;
a photoinitiator (D); and
an organic solvent (E),
wherein the pigment (A) comprises a first pigment (A-1) represented by formula (1),

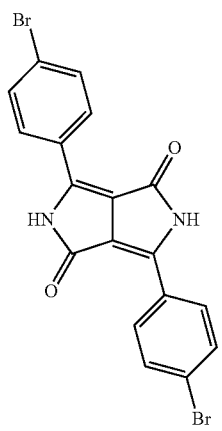

formula (1)

the alkali-soluble resin (B) comprises a first alkali-soluble resin (B-1) represented by formula (2);

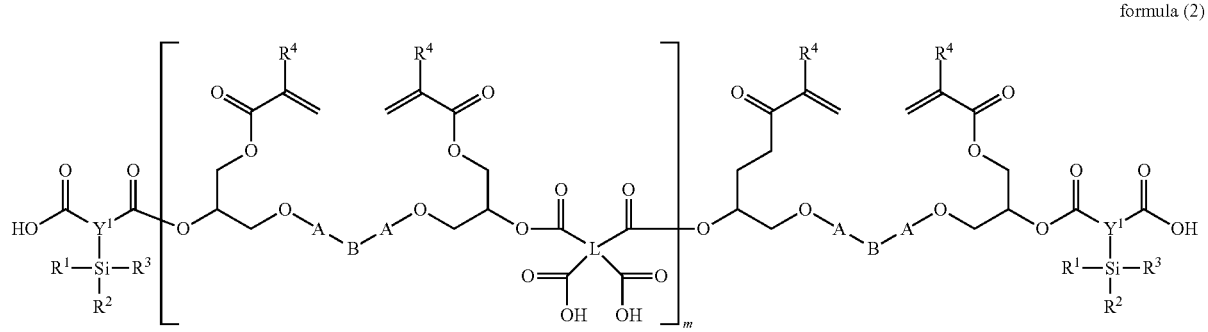

formula (2)

in formula (2), A represents a phenylene group or a phenylene group having a substituent, wherein the substituent is a $C_{1-5}$ alkyl group, a halogen atom, or a phenyl group; B represents —CO—, —SO$_2$—, —C(CF$_3$)$_2$—, —Si(CH$_3$)$_2$—, —CH$_2$—, —C(CH$_3$)$_2$—, —O—, 9,9-fluorenylidene, or a single bond; L represents a tetravalent carboxylic acid residue; $Y^1$ represents a $C_{1-20}$ trivalent organic group; $R^1$, $R^2$, and $R^3$ each independently represent a hydrogen atom, a halogen atom, or a monovalent organic group; $R^4$ represents a hydrogen atom or a methyl group; and m represents an integer of 1 to 20.

2. The photosensitive resin composition of claim 1, wherein the first alkali-soluble resin (B-1) is obtained by reacting a first mixture, the first mixture comprising:
 a diol compound (b-1) containing a polymeric unsaturated group;
 a tetracarboxylic acid or an acid dianhydride thereof (b-2); and
 a dicarboxylic acid anhydride (b-3) represented by formula (3), 4. The photosensitive resin composition of claim 2, wherein a molar ratio (b-3)/(b-1) of the diol compound (b-1) containing a polymeric unsaturated group and the dicarboxylic acid anhydride (b-3) represented by formula (3) is 0.02 to 1.6.

5. The photosensitive resin composition of claim 1, wherein the alkali-soluble resin (B) further comprises a second alkali-soluble resin (B-2) other than the first alkali-soluble resin (B-1) and the second alkali-soluble resin (B-2) is obtained by reacting a second mixture, the second mixture comprising:
 an epoxy compound having at least two epoxy groups; and
 a compound having at least one carboxylic acid group and at least one ethylenically unsaturated group.

6. The photosensitive resin composition of claim 5, wherein the epoxy compound having at least two epoxy groups comprises a compound represented by formula (4), a compound represented by formula (5), or a combination of the two,

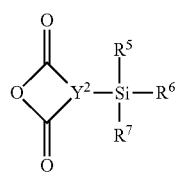

formula (3)

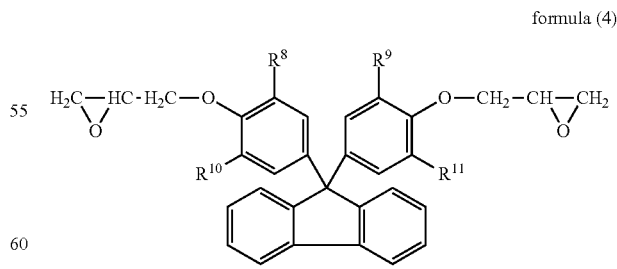

formula (4)

in formula (3), $Y^2$ represents a $C_{1-20}$ trivalent organic group; and $R^5$, $R^6$, and $R^7$ each independently represent a hydrogen atom, a halogen atom, or a monovalent organic group.

3. The photosensitive resin composition of claim 2, wherein a molar ratio (b-2)/(b-1) of the diol compound (b-1) containing a polymeric unsaturated group and the tetracarboxylic acid or an acid dianhydride thereof (b-2) is 0.2 to 1.0.

in formula (4), $R^8$, $R^9$, $R^{10}$, and $R^{11}$ each independently represent a hydrogen atom, a halogen atom, a $C_1$-$C_5$ alkyl group, a $C_1$-$C_5$ alkoxy group, a $C_6$-$C_{12}$ aryl group, or a $C_6$-$C_{12}$ aralkyl group, formula (5)

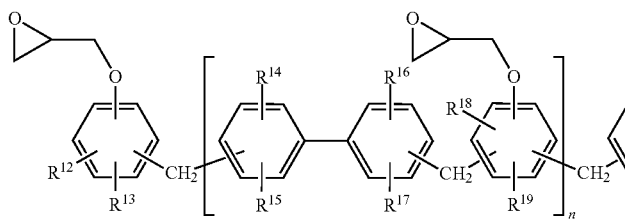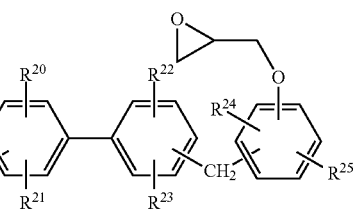

in formula (5), $R^{12}$ to $R^{25}$ each independently represent a hydrogen atom, a halogen atom, a $C_1$-$C_8$ alkyl group, or a $C_6$-$C_{15}$ aromatic group, and n represents an integer of 0 to 10.

7. The photosensitive resin composition of claim 5, wherein a weight ratio of the first alkali-soluble resin (B-1) and the second alkali-soluble resin (B-2) is at least 10:90 and less than 100:0.

8. The photosensitive resin composition of claim 1, wherein based on a usage amount of 100 parts by weight of the alkai-soluble resin (B), a usage amount of the pigment (A) is 60 parts by weight to 600 parts by weight, a usage amount of the first pigment (A-1) is 40 parts by weight to 400 parts by weight, a usage amount of the compound (C) containing an ethylenically unsaturated group is 40 parts by weight to 400 parts by weight, a usage amount of the photoinitiator (D) is 10 parts by weight to 100 parts by weight, and a usage amount of the organic solvent (E) is 500 parts by weight to 5000 parts by weight.

9. The photosensitive resin composition of claim 1, wherein the pigment (A) further comprises a second pigment (A-2) other than the first pigment (A-1), and the second pigment (A-2) is selected from the group consisting of a diketopyrrolopyrrole pigment, an azo pigment, an anthraquinone pigment, a perylene pigment, a quinacridone pigment, a benzimidazolone pigment, and a quinoline pigment.

10. The photosensitive resin composition of claim 9, wherein based on a usage amount of 100 parts by weight of the alkali-soluble resin (B), a usage amount of the second pigment (A-2) is 20 parts by weight to 200 parts by weight.

11. The photosensitive resin composition of claim 1, wherein the compound (C) containing an ethylenically unsaturated group comprises a first compound (C-1), and the first compound (C-1) is selected from the group consisting of a compound represented by formula (6), a compound represented by formula (7), and a compound represented by formula (8), formula (6)

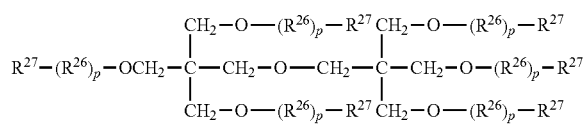

-continued formula (7)

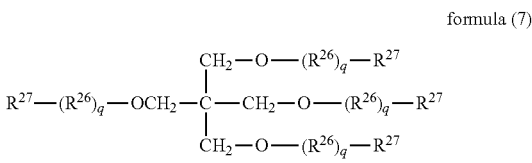

formula (8)

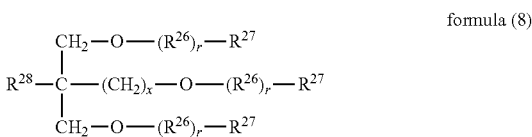

in formula (6) to formula (8), $R^{26}$ each independently represents —($CH_2CH_2O$)— or —($CH_2CH(CH_3)O$)—; $R^{27}$ each independently represents an acryloyl group, a methacryloyl group, or a hydrogen atom; $R^{28}$ each independently represents a hydrogen atom, a $C_1$-$C_6$ alkyl group or a $C_1$-$C_6$ aryl group; in formula (6), a total number of the acryloyl groups and the methacryloyl groups is 5 or 6; in formula (7), a total number of the acryloyl groups and the methacryloyl groups is 3 or 4; in formula (8), a total number of the acryloyl groups and the methacryloyl groups is 3; p each independently represents an integer of 0 to 6, and a sum of each p is 3 to 24; q each independently represents an integer of 0 to 6, and a sum of each q is 2 to 16; r each independently represents an integer of 0 to 10, and a sum of each r is 3 to 30; and x represents an integer of 0 to 3.

12. The photosensitive resin composition of claim 11, wherein based on a usage amount of 100 parts by weight of the alkali-soluble resin (B), a usage amount of the first compound (C-1) is 5 parts by weight to 60 parts by weight.

13. The photosensitive resin composition of claim 1, wherein the compound (C) containing an ethylenically unsaturated group comprises a second compound (C-2), and the second compound (C-2) is a compound represented by formula (9),

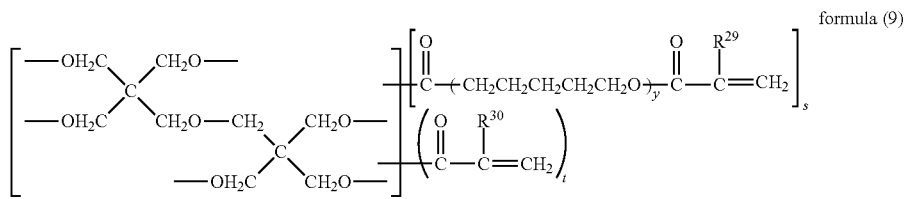

formula (9)

in formula (9), $R^{29}$ and $R^{30}$ each independently represent a hydrogen atom or a methyl group; y represents an integer of 1 to 2; s represents an integer of 1 to 6; t represents an integer of 0 to 5; and a sum of s and t is 2 to 6.

14. The photosensitive resin composition of claim 13, wherein based on a usage amount of 100 parts by weight of the alkali-soluble resin (B), a usage amount of the second compound (C-2) is 5 parts by weight to 60 parts by weight.

15. A method for manufacturing a color filter, wherein the method comprises using a pixel layer formed by the photosensitive resin composition of claim 1.

16. A color filter obtained by the method of claim 15.

17. A liquid crystal display apparatus comprising the color filter of claim 16.

* * * * *